United States Patent
Bykanov et al.

(10) Patent No.: US 11,073,487 B2
(45) Date of Patent: Jul. 27, 2021

(54) METHODS AND SYSTEMS FOR CHARACTERIZATION OF AN X-RAY BEAM WITH HIGH SPATIAL RESOLUTION

(71) Applicant: KLA-Tencor Corporation, Milpitas, CA (US)

(72) Inventors: Alexander Bykanov, Escondido, CA (US); Nikolay Artemiev, Berkeley, CA (US); Joseph A. Di Regolo, Livermore, CA (US); Antonio Gellineau, Santa Clara, CA (US); Alexander Kuznetsov, Austin, TX (US); Andrei Veldman, Sunnyvale, CA (US); John Hench, Los Gatos, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 89 days.

(21) Appl. No.: 15/974,962

(22) Filed: May 9, 2018

(65) Prior Publication Data
US 2018/0328868 A1    Nov. 15, 2018

Related U.S. Application Data

(60) Provisional application No. 62/505,014, filed on May 11, 2017.

(51) Int. Cl.
*G01N 23/02* (2006.01)
*G01N 23/201* (2018.01)
(Continued)

(52) U.S. Cl.
CPC ......... *G01N 23/201* (2013.01); *G01N 23/205* (2013.01); *G01N 23/207* (2013.01);
(Continued)

(58) Field of Classification Search
CPC . G01N 23/20025; G01N 23/203; G21K 1/062
See application file for complete search history.

(56) References Cited

U.S. PATENT DOCUMENTS 5,608,526 A    3/1997    Piwonka-Corle et al.
5,859,424 A    1/1999    Norton et al.
(Continued)

FOREIGN PATENT DOCUMENTS

WO    WO 03-097290 A1    11/2003

OTHER PUBLICATIONS

Lemaillet, Germer, Kline et al.,"Intercomparison between optical and x-ray scatterometry measurements of FinFET structures" by Proc. SPIE, v.8681, p. 86810Q (2013).
(Continued)

*Primary Examiner* — David P Porta
*Assistant Examiner* — Mamadou Faye
(74) *Attorney, Agent, or Firm* — Spano Law Group; Joseph S. Spano

(57) ABSTRACT

Methods and systems for positioning a specimen and characterizing an x-ray beam incident onto the specimen in a Transmission, Small-Angle X-ray Scatterometry (T-SAXS) metrology system are described herein. A specimen positioning system locates a wafer vertically and actively positions the wafer in six degrees of freedom with respect to the x-ray illumination beam without attenuating the transmitted radiation. In some embodiments, a cylindrically shaped occlusion element is scanned across the illumination beam while the detected intensity of the transmitted flux is measured to precisely locate the beam center. In some other embodiments, a periodic calibration target is employed to precisely locate the beam center. The periodic calibration target includes one or more spatially defined zones having
(Continued)

different periodic structures that diffract X-ray illumination light into distinct, measurable diffraction patterns.

35 Claims, 17 Drawing Sheets

(51) Int. Cl.
*H01L 21/67* (2006.01)
*G01N 23/205* (2018.01)
*G01N 23/207* (2018.01)
*H01L 21/68* (2006.01)
*H01L 21/687* (2006.01)

(52) U.S. Cl.
CPC .. *H01L 21/67259* (2013.01); *H01L 21/67282* (2013.01); *H01L 21/67288* (2013.01); *G01N 2223/6116* (2013.01); *H01L 21/681* (2013.01); *H01L 21/68764* (2013.01)

(56) References Cited

U.S. PATENT DOCUMENTS

| | | |
|---|---|---|
| 6,023,338 A | 2/2000 | Bareket |
| 6,429,943 B1 | 8/2002 | Opsal et al. |
| 6,716,646 B1 | 4/2004 | Wright et al. |
| 6,778,275 B2 | 8/2004 | Bowes |
| 6,787,773 B1 | 9/2004 | Lee |
| 6,992,764 B1 | 1/2006 | Yang et al. |
| 7,242,477 B2 | 7/2007 | Mieher et al. |
| 7,321,426 B1 | 1/2008 | Poslaysky et al. |
| 7,406,153 B2 | 7/2008 | Berman |
| 7,478,019 B2 | 1/2009 | Zangooie et al. |
| 7,626,702 B2 | 12/2009 | Ausschnitt et al. |
| 7,656,528 B2 | 2/2010 | Abdulhalim et al. |
| 7,826,071 B2 | 11/2010 | Shchegrov et al. |
| 7,842,933 B2 | 11/2010 | Shur et al. |
| 7,873,585 B2 | 1/2011 | Izikson |
| 7,929,667 B1 | 4/2011 | Zhuang et al. |
| 7,933,026 B2 | 4/2011 | Opsal et al. |
| 8,068,662 B2 | 11/2011 | Zhang et al. |
| 8,138,498 B2 | 3/2012 | Ghinovker |
| 9,093,458 B2* | 7/2015 | Amir ................ H01L 23/544 |
| 2003/0021465 A1 | 1/2003 | Adel et al. |
| 2006/0213537 A1 | 9/2006 | Atalla |
| 2007/0076205 A1* | 4/2007 | Schulz .............. G03F 7/70633 356/401 |
| 2007/0176128 A1 | 8/2007 | Van Bilsen et al. |
| 2007/0221842 A1 | 9/2007 | Morokuma et al. |
| 2008/0165345 A1* | 7/2008 | Hill ..................... G01D 5/266 356/72 |
| 2009/0152463 A1 | 6/2009 | Toyoda et al. |
| 2011/0210250 A1* | 9/2011 | Nakayama .......... B82Y 35/00 250/310 |
| 2011/0266440 A1 | 11/2011 | Boughorbel et al. |
| 2012/0292502 A1 | 11/2012 | Langer et al. |
| 2013/0208279 A1 | 8/2013 | Smith |
| 2013/0304424 A1 | 11/2013 | Bakeman et al. |
| 2014/0019097 A1 | 1/2014 | Bakeman et al. |
| 2014/0064445 A1 | 3/2014 | Adler |
| 2014/0111791 A1 | 4/2014 | Manassen et al. |
| 2014/0172394 A1 | 6/2014 | Kuznetsov et al. |
| 2014/0222380 A1 | 8/2014 | Kuznetsov et al. |
| 2014/0297211 A1 | 10/2014 | Pandev et al. |
| 2015/0110249 A1 | 4/2015 | Bakeman et al. |
| 2015/0117610 A1 | 4/2015 | Veldman et al. |
| 2015/0204664 A1 | 7/2015 | Bringoltz et al. |
| 2015/0204806 A1* | 7/2015 | Mazor ................ G01N 23/223 378/46 |
| 2015/0300965 A1 | 10/2015 | Sezginer et al. |
| 2016/0202193 A1 | 7/2016 | Hench et al. |
| 2016/0320319 A1 | 11/2016 | Hench et al. |
| 2017/0167862 A1 | 6/2017 | Dziura et al. |
| 2018/0106735 A1 | 4/2018 | Gellineau et al. |

OTHER PUBLICATIONS

Kline et al., "X-ray scattering critical dimensional metrology using a compact x-ray source for next generation semiconductor devices," J. Micro/Nanolith. MEMS MOEMS 16(1), 014001 (Jan.-Mar. 2017).
International Search Report dated Aug. 30, 2018, for PCT Application No. PCT/US2018/032141 filed on May 10, 2018 by KLA-Tencor Corporation, 5 pages.

* cited by examiner

METHODS AND SYSTEMS FOR CHARACTERIZATION OF AN X-RAY BEAM WITH HIGH SPATIAL RESOLUTION

CROSS REFERENCE TO RELATED APPLICATION

The present application for patent claims priority under 35 U.S.C. § 119 from U.S. provisional patent application Ser. No. 62/505,014, filed May 11, 2017, the subject matter of which is incorporated herein by reference in its entirety.

TECHNICAL FIELD

The described embodiments relate to x-ray metrology systems and methods, and more particularly to methods and systems for improved measurement accuracy.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. A number of metrology based techniques including scatterometry and reflectometry implementations and associated analysis algorithms are commonly used to characterize critical dimensions, film thicknesses, composition and other parameters of nanoscale structures.

Traditionally, scatterometry critical dimension measurements are performed on targets consisting of thin films and/or repeated periodic structures. During device fabrication, these films and periodic structures typically represent the actual device geometry and material structure or an intermediate design. As devices (e.g., logic and memory devices) move toward smaller nanometer-scale dimensions, characterization becomes more difficult. Devices incorporating complex three-dimensional geometry and materials with diverse physical properties contribute to characterization difficulty. For example, modern memory structures are often high-aspect ratio, three-dimensional structures that make it difficult for optical radiation to penetrate to the bottom layers. Optical metrology tools utilizing infrared to visible light can penetrate many layers of translucent materials, but longer wavelengths that provide good depth of penetration do not provide sufficient sensitivity to small anomalies. In addition, the increasing number of parameters required to characterize complex structures (e.g., FinFETs), leads to increasing parameter correlation. As a result, the parameters characterizing the target often cannot be reliably decoupled with available measurements.

In one example, longer wavelengths (e.g. near infrared) have been employed in an attempt to overcome penetration issues for 3D FLASH devices that utilize polysilicon as one of the alternating materials in the stack. However, the mirror like structure of 3D FLASH intrinsically causes decreasing light intensity as the illumination propagates deeper into the film stack. This causes sensitivity loss and correlation issues at depth. In this scenario, SCD is only able to successfully extract a reduced set of metrology dimensions with high sensitivity and low correlation.

In another example, opaque, high-k materials are increasingly employed in modern semiconductor structures. Optical radiation is often unable to penetrate layers constructed of these materials. As a result, measurements with thin-film scatterometry tools such as ellipsometers or reflectometers are becoming increasingly challenging.

In response to these challenges, more complex optical metrology tools have been developed. For example, tools with multiple angles of illumination, shorter illumination wavelengths, broader ranges of illumination wavelengths, and more complete information acquisition from reflected signals (e.g., measuring multiple Mueller matrix elements in addition to the more conventional reflectivity or ellipsometric signals) have been developed. However, these approaches have not reliably overcome fundamental challenges associated with measurement of many advanced targets (e.g., complex 3D structures, structures smaller than 10 nm, structures employing opaque materials) and measurement applications (e.g., line edge roughness and line width roughness measurements).

Atomic force microscopes (AFM) and scanning-tunneling microscopes (STM) are able to achieve atomic resolution, but they can only probe the surface of the specimen. In addition, AFM and STM microscopes require long scanning times. Scanning electron microscopes (SEM) achieve intermediate resolution levels, but are unable to penetrate structures to sufficient depth. Thus, high-aspect ratio holes are not characterized well. In addition, the required charging of the specimen has an adverse effect on imaging performance. X-ray reflectometers also suffer from penetration issues that limit their effectiveness when measuring high aspect ratio structures.

To overcome penetration depth issues, traditional imaging techniques such as TEM, SEM etc., are employed with destructive sample preparation techniques such as focused ion beam (FIB) machining, ion milling, blanket or selective etching, etc. For example, transmission electron microscopes (TEM) achieve high resolution levels and are able to probe arbitrary depths, but TEM requires destructive sectioning of the specimen. Several iterations of material removal and measurement generally provide the information required to measure the critical metrology parameters throughout a three dimensional structure. But, these techniques require sample destruction and lengthy process times. The complexity and time to complete these types of measurements introduces large inaccuracies due to drift of etching and metrology steps. In addition, these techniques require numerous iterations which introduce registration errors.

Transmission, Small-Angle X-Ray Scatterometry (T-SAXS) systems employing photon at a hard X-ray energy level (>15 keV) have shown promise to address challenging measurement applications. Various aspects of the application of SAXS technology to the measurement of critical dimensions (CD-SAXS) and overlay (OVL-SAXS) are described in 1) U.S. Pat. No. 7,929,667 to Zhuang and Fielden, entitled "High-brightness X-ray metrology," 2) U.S. Patent Publication No. 2014/0019097 by Bakeman, Shchegrov, Zhao, and Tan, entitled "Model Building And Analysis Engine For Combined X-Ray And Optical Metrology," 3) U.S. Patent Publication No. 2015/0117610 by Veldman, Bakeman, Shchegrov, and Mieher, entitled "Methods and Apparatus For Measuring Semiconductor Device Overlay Using X-Ray Metrology," 4) U.S. Patent Publication No. 2016/0202193 by Hench, Shchegrov, and Bakeman, entitled "Measurement System Optimization For X-Ray Based Metrology," 5) U.S. Patent Publication No. 2017/0167862 by Dziura, Gellineau, and Shchegrov, entitled "X-ray Metrology For High Aspect Ratio Structures," and 6) U.S. Patent Publication No. 2018/0106735 by Gellineau, Dziura, Hench, Veldman, and Zalubovsky, entitled "Full Beam Metrology for X-Ray Scatterometry Systems." The aforementioned patent documents are assigned to KLA-Tencor Corporation, Milpitas, Calif. (USA).

SAXS has also been applied to the characterization of materials and other non-semiconductor related applications. Exemplary systems have been commercialized by several companies, including Xenocs SAS (www.xenocs.com), Bruker Corporation (www.bruker.com), and Rigaku Corporation (www.rigaku.com/en).

Research on CD-SAXS metrology of semiconductor structures is also described in scientific literature. Most research groups have employed high-brightness X-ray synchrotron sources which are not suitable for use in a semiconductor fabrication facility due to their immense size, cost, etc. One example of such a system is described in the article entitled "Intercomparison between optical and x-ray scatterometry measurements of FinFET structures" by Lemaillet, Germer, Kline et al., Proc. SPIE, v. 8681, p. 86810Q (2013). More recently, a group at the National Institute of Standards and Technology (NIST) has initiated research employing compact and bright X-ray sources similar those described in U.S. Pat. No. 7,929,667. This research is described in an article entitled "X-ray scattering critical dimensional metrology using a compact x-ray source for next generation semiconductor devices," J. Micro/Nanolith. MEMS MOEMS 16(1), 014001 (January-March 2017).

The interaction of the X-ray beam with the target must be calibrated and aligned with the metrology system to ensure effective measurements. Exemplary characterizations include precisely locating the peak intensity of the X-ray beam on the target, measuring the X-Ray beam intensity distribution, identifying the boundaries of the X-ray beam such that only a certain percentage of beam flux lies outside of the boundaries. Exemplary alignments include alignment of the X-ray beam with an optical vision system, alignment of the X-ray beam with specific mechanical features of the tool (e.g., axes of wafer rotation, etc.), etc.

In general, a wafer is navigated in the path of the X-Ray beam based on optical measurements of alignment markers disposed throughout the wafer by an optical microscope. To ensure that a particular target is precisely navigated with respect to the X-ray beam, the beam profile needs to be measured in the coordinates of the optical microscope employed to measure the markers.

In some examples, the optical microscope is aligned with a knife edge and the knife edge is aligned with the X-ray beam. Characterization of an X-ray beam with traditional knife edges is complicated due to the semi-transparency of the knife material illuminated by X-ray radiation near the edges of the knife edge. For example, tungsten has a beam attenuation length of about 8.4 micrometers when illuminated by photons having an energy level of 20 keV. At this length, the transmission drops by factor of ~1/e (e=2.718). For a knife edge shaped at an angle of 30 degrees, the length of the wedge corresponding to a height of 8.4 micrometer is approximately 14.5 micrometers. This simple estimate of the uncertainty of a knife edge position during an X-ray beam scan illustrates that when the required alignment accuracy is less than a few micrometers (e.g., less than 10 micrometers), the semi-transparency of the knife edge is limiting.

In some other examples, the X-ray beam profile is characterized by a high resolution X-ray camera located at some point (e.g., a focal spot of the focusing optics) with respect to the X-ray beam. In these examples, the beam profile is measured with the high resolution X-ray camera, and the measured coordinates of the beam are transferred to the optical microscope employed to navigate the wafer in the path of the X-ray beam. Unfortunately, errors associated with transferring the measured coordinates from the X-ray camera to the optical microscope are significant and exceed the required accuracy of navigation.

Furthermore, characterization of the X-ray beam by an X-ray camera or knife edges are intrinsically indirect and do not provide quantitative data on photon flux incident on the target as well as photon contamination of neighboring regions.

Future metrology applications present challenges for metrology due to increasingly small resolution requirements, multi-parameter correlation, increasingly complex geometric structures including high aspect ratio structures, and increasing use of opaque materials. Existing methods of X-ray tool alignment and target navigation are limited to an accuracy of approximately 10-20 micrometers. These methods are not able to position and measure metrology targets of small sizes (~50 micrometers) in an X-ray beam with sufficient accuracy for semiconductor metrology applications. Thus, methods and systems for improved alignment and calibration of X-ray beams in SAXS systems are desired to meet the placement requirements of advanced manufacturing nodes.

SUMMARY

Methods and systems for positioning a specimen and characterizing an x-ray beam incident onto the specimen in a Transmission, Small-Angle X-ray Scatterometry (T-SAXS) metrology system are described herein. Practical T-SAXS measurements in a semiconductor manufacturing environment require measurements over a large range of angles of incidence and azimuth with respect to the surface of a specimen (e.g., semiconductor wafer) with a small beam spot size (e.g., less than 50 micrometers across the effective illumination spot). Accurate positioning of the wafer and characterization of the beam size and shape are required to achieve small measurement box size. In addition, calibrations that accurately locate the illumination beam on the desired target area on the surface of a semiconductor wafer over the full range of incidence and azimuth angles are presented herein.

In one aspect, a metrology tool includes a specimen positioning system configured to locate a wafer vertically (i.e., plane of the wafer surface approximately aligned with the gravity vector) and actively position the wafer in six degrees of freedom with respect to the illumination beam. The specimen positioning system supports the wafer at the edges; allowing the illumination beam to transmit through the wafer at any location within the active area of the wafer without remounting. By supporting the wafer vertically at its edges, gravity induced sag of the wafer is effectively mitigated.

In a further aspect, a counterweight statically balances the rotating mass of the specimen positioning system such that the center of gravity of the rotating mass is approximately aligned with its axis of rotation.

In some embodiments, three sensors are disposed on the specimen positioning system to measure the distance of the backside of the wafer with respect to the specimen positioning system. In this manner, wafer bow is measured and compensated by movement of the wafer using a tip-tilt-Z stage.

In another aspect, a SAXS metrology system employs at least one beam occlusion calibration target to locate an x-ray illumination beam with respect to the specimen positioning system. The beam occlusion calibration target includes at least one marker and a cylindrically shaped occlusion element. An alignment camera is employed to locate the marker in coordinates of the specimen positioning system. The location of the marker with respect to the cylindrically shaped occlusion element is known apriori (e.g., with an accuracy of less than 200 nanometers). Thus, the location of the cylindrically shaped occlusion element in coordinates of the specimen positioning system is easily determined by a straightforward coordinate transformation. The cylindrically shaped occlusion element is scanned across the illumination beam while the detected intensity of the transmitted flux is measured. The center of the illumination beam is precisely located with respect to the cylindrically shaped occlusion element based on the measured intensity. Since the location of the cylindrically shaped occlusion element is known in the coordinates of the specimen positioning system, the location of center of the illumination beam in the coordinates of the specimen positioning system is precisely located by simple coordinate transformation.

In some examples, a beam occlusion calibration target is employed to calibrate the location of incidence of the illumination beam with respect to the specimen positioning system. In some other examples, a beam occlusion calibration target is employed to align the axis of rotation of the stage reference frame with respect to the illumination beam at the point of incidence of illumination beam with a wafer.

In another aspect, a SAXS metrology system employs at least one periodic calibration target to locate an x-ray illumination beam with respect to the specimen positioning system. Each periodic calibration target includes one or more spatially defined zones having different periodic structures that diffract X-ray illumination light into distinct diffraction patterns measurable by a SAXS metrology system described herein. In addition, each periodic calibration target includes one or more markers readable by an optical microscope to locate the periodic calibration target with respect the specimen positioning system with high alignment accuracy (e.g., alignment accuracy of 0.5 micrometers or less). Each spatially defined zone has spatially well-defined boundary lines. The location of the boundary lines is known relative to the markers with high accuracy in one or more dimensions (e.g., accuracy of 0.2 micrometers or less).

In another aspect, the precise alignment of the axis of rotation with the illumination beam in the plane of the surface of the wafer is determined based on the interaction of the illumination beam with two or more beam occlusion calibration targets as measured by the x-ray detector.

In another aspect, the precise alignment of the axis of rotation with a marker of a calibration target in the plane of the surface of the wafer is determined based on images of the marker collected by an alignment camera mounted to a lateral alignment stage.

In another aspect, the shape of the surface of the wafer in the Z-direction is mapped using any of the alignment camera, an optical proximity sensor, a capacitive proximity sensor, an interferometry based sensor, or any other suitable proximity sensor. In some examples, the wafer surface is mapped on the front side (i.e., patterned side) of the wafer. In some other examples, the wafer surface is mapped on the back side (i.e., unpatterned side) of the wafer, provided the thickness of the wafer is sufficiently uniform, well modeled, or measured in-situ or apriori.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for positioning a specimen and characterizing an x-ray beam incident onto the specimen in a Transmission, Small-Angle X-ray Scatterometry (T-SAXS) metrology system are described herein. Practical T-SAXS measurements in a semiconductor manufacturing environment require measurements over a large range of angles of incidence and azimuth with respect to the surface of a specimen (e.g., semiconductor wafer) with a small beam spot size (e.g., less than 50 micrometers across the effective illumination spot). Accurate positioning of the wafer and characterization of the beam size and shape are required to achieve small measurement box size. In addition, calibrations that accurately locate the illumination beam on the desired target area on the surface of a semiconductor wafer over the full range of incidence and azimuth angles are presented herein.

A six degree of freedom specimen positioning system is presented herein. In addition, specialized calibration targets described herein enable high accuracy characterization of the x-ray beam profile and high accuracy alignment of the X-ray beam with respect to the calibration targets. This enables precise navigation of the wafer required to measure small box size metrology targets (e.g., metrology targets located in scribe lines having dimensions of 100 micrometer or less).

Figure 1:
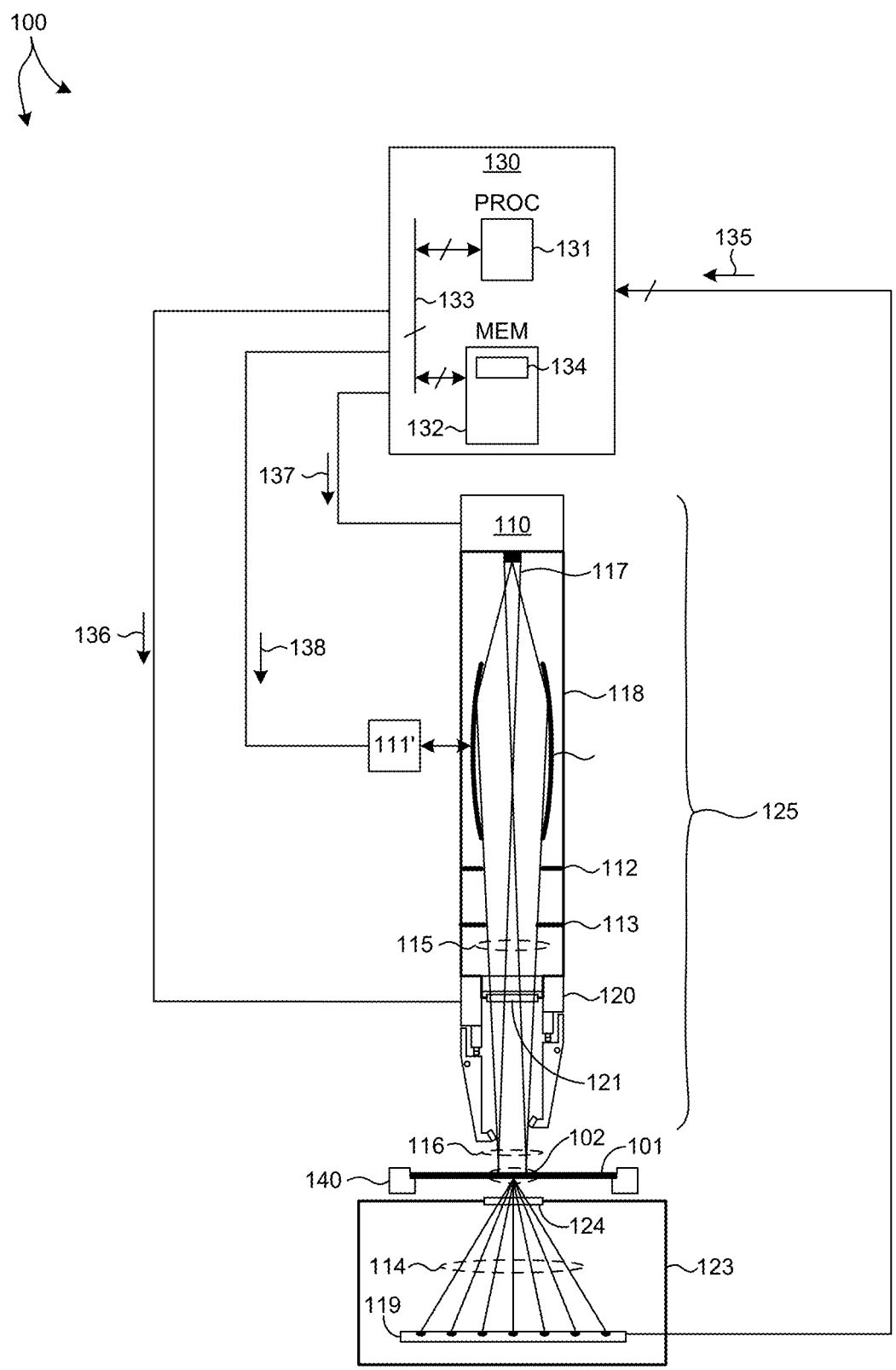
FIG. 1 is a diagram illustrative of a metrology system 100 configured to perform calibration of various system parameters in accordance with the methods described herein.

FIG. 1 illustrates an embodiment of a T-SAXS metrology tool 100 for measuring characteristics of a specimen in at least one novel aspect. As shown in FIG. 1, the system 100 may be used to perform T-SAXS measurements over an inspection area 102 of a specimen 101 illuminated by an illumination beam spot.

In the depicted embodiment, metrology tool 100 includes an x-ray illumination subsystem 125 including an x-ray illumination source 110, focusing optics 111, beam divergence control slit 112, intermediate slit 113, and beam shaping slit mechanism 120. The x-ray illumination source 110 is configured to generate x-ray radiation suitable for T-SAXS measurements. In some embodiments, the x-ray illumination source 110 is configured to generate wavelengths between 0.01 nanometers and 1 nanometer. In general, any suitable high-brightness x-ray illumination source capable of generating high brightness x-rays at flux levels sufficient to enable high-throughput, inline metrology may be contemplated to supply x-ray illumination for T-SAXS measurements. In some embodiments, an x-ray source includes a tunable monochromator that enables the x-ray source to deliver x-ray radiation at different, selectable wavelengths.

In some embodiments, one or more x-ray sources emitting radiation with photon energy greater than 15 keV are employed to ensure that the x-ray source supplies light at wavelengths that allow sufficient transmission through the entire device as well as the wafer substrate. By way of non-limiting example, any of a particle accelerator source, a liquid anode source, a rotating anode source, a stationary, solid anode source, a microfocus source, a microfocus rotating anode source, a plasma based source, and an inverse Compton source may be employed as x-ray illumination source 110. In one example, an inverse Compton source available from Lyncean Technologies, Inc., Palo Alto, Calif. (USA) may be contemplated. Inverse Compton sources have an additional advantage of being able to produce x-rays over a range of photon energies, thereby enabling the x-ray source to deliver x-ray radiation at different, selectable wavelengths.

Exemplary x-ray sources include electron beam sources configured to bombard solid or liquid targets to stimulate x-ray radiation. Methods and systems for generating high brightness, liquid metal x-ray illumination are described in U.S. Pat. No. 7,929,667, issued on Apr. 19, 2011, to KLA-Tencor Corp., the entirety of which is incorporated herein by reference.

X-ray illumination source 110 produces x-ray emission over a source area having finite lateral dimensions (i.e., non-zero dimensions orthogonal to the beam axis. Focusing optics 111 focuses source radiation onto a metrology target located on specimen 101. The finite lateral source dimension results in finite spot size 102 on the target defined by the rays 117 coming from the edges of the source. In some embodiments, focusing optics 111 includes elliptically shaped focusing optical elements.

A beam divergence control slit 112 is located in the beam path between focusing optics 111 and beam shaping slit mechanism 120. Beam divergence control slit 112 limits the divergence of the illumination provided to the specimen under measurement. An additional intermediate slit 113 is located in the beam path between beam divergence control slit 112 and beam shaping slit mechanism 120. Intermediate slit 113 provides additional beam shaping. In general, however, intermediate slit 113 is optional.

Beam shaping slit mechanism 120 is located in the beam path immediately before specimen 101. In one aspect, the slits of beam shaping slit mechanism 120 are located in close proximity to specimen 101 to minimize the enlargement of the incident beam spot size due to beam divergence defined by finite source size. In one example, expansion of the beam spot size due to shadow created by finite source size is approximately one micrometer for a 10 micrometer x-ray source size and a distance of 25 millimeters between the beam shaping slits and specimen 101.

In some embodiments, beam shaping slit mechanism 120 includes multiple, independently actuated beam shaping slits. In one embodiment, beam shaping slit mechanism 120 includes four independently actuated beam shaping slits. These four beams shaping slits effectively block a portion of incoming beam 115 and generate an illumination beam 116 having a box shaped illumination cross-section.

Figure 2:
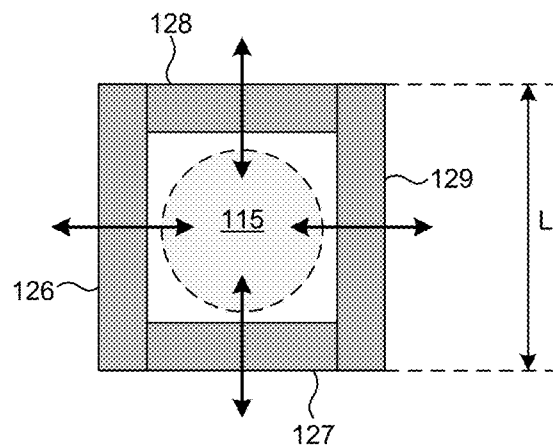
FIG. 2 depicts an end view of beam shaping slit mechanism 120 in one configuration.
Figure 3:
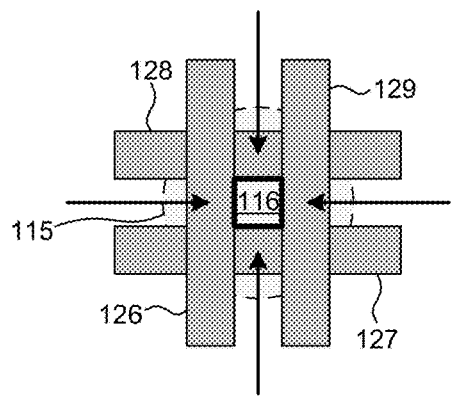
FIG. 3 depicts an end view of beam shaping slit mechanism 120 in another configuration.

FIGS. 2 and 3 depict an end view of beam shaping slit mechanism 120 depicted in FIG. 1 in two different configurations. As illustrated in FIGS. 2 and 3, the beam axis is perpendicular to the drawing page. As depicted in FIG. 2, incoming beam 115 has a large cross-section. In some embodiments, incoming beam 115 has a diameter of approximately one millimeter. Furthermore, the location of incoming beam 115 within beam shaping slits 126-129 may have an uncertainty of approximately three millimeters due to beam pointing errors. To accommodate the size of the incoming beam and the uncertainty of the beam location, each slit has a length, L, of approximately six millimeters. As depicted in FIG. 2, each slit is moveable in a direction perpendicular to the beam axis. In the illustration of FIG. 2, slits 126-129 are located at a maximum distance from the beam axis (i.e., the slits are fully open and they are not restricting the light passing through beam shaping slit mechanism 120.

FIG. 3 depicts slits 126-129 of beam shaping slit mechanism 120 in positions that block a portion of incoming beam 115, such that outgoing beam 116 delivered to the specimen under measurement has reduced size and well-defined shape. As depicted in FIG. 3, each of slits 126-129 has moved inward, toward the beam axis to achieve the desired output beam shape.

Slits 126-129 are constructed from materials that minimize scattering and effectively block incident radiation. Exemplary materials include single crystal materials such as Germanium, Gallium Arsenide, Indium Phosphide, etc. Typically, the slit material is cleaved along a crystallographic direction, rather than sawn, to minimize scattering across structural boundaries. In addition, the slit is oriented with respect to the incoming beam such that the interaction between the incoming radiation and the internal structure of the slit material produces a minimum amount of scattering. The crystals are attached to each slit holder made of high density material (e.g., tungsten) for complete blocking of the x-ray beam on one side of the slit. In some embodiments, each slit has a rectangular cross-section having a width is approximately 0.5 millimeters and a height of approximately 1-2 millimeters. As depicted in FIG. 2, the length, L, of a slit is approximately 6 millimeters.

In general, x-ray optics shape and direct x-ray radiation to specimen 101. In some examples, the x-ray optics include an x-ray monochromator to monochromatize the x-ray beam that is incident on the specimen 101. In some examples, the x-ray optics collimate or focus the x-ray beam onto measurement area 102 of specimen 101 to less than 1 milliradian divergence using multilayer x-ray optics. In these examples, the multilayer x-ray optics function as a beam monochromator, also. In some embodiments, the x-ray optics include one or more x-ray collimating mirrors, x-ray apertures, x-ray beam stops, refractive x-ray optics, diffractive optics such as zone plates, Montel optics, specular x-ray optics such as grazing incidence ellipsoidal mirrors, polycapillary optics such as hollow capillary x-ray waveguides, multilayer optics or systems, or any combination thereof. Further details are described in U.S. Patent Publication No. 2015/0110249, the content of which is incorporated herein by reference it its entirety.

X-ray detector 119 collects x-ray radiation 114 scattered from specimen 101 and generates an output signals 135 indicative of properties of specimen 101 that are sensitive to the incident x-ray radiation in accordance with a T-SAXS measurement modality. In some embodiments, scattered x-rays 114 are collected by x-ray detector 119 while specimen positioning system 140 locates and orients specimen 101 to produce angularly resolved scattered x-rays.

In some embodiments, a T-SAXS system includes one or more photon counting detectors with high dynamic range (e.g., greater than $10^5$). In some embodiments, a single photon counting detector detects the position and number of detected photons.

In some embodiments, the x-ray detector resolves one or more x-ray photon energies and produces signals for each x-ray energy component indicative of properties of the specimen. In some embodiments, the x-ray detector 119 includes any of a CCD array, a microchannel plate, a photodiode array, a microstrip proportional counter, a gas filled proportional counter, a scintillator, or a fluorescent material.

In this manner the X-ray photon interactions within the detector are discriminated by energy in addition to pixel location and number of counts. In some embodiments, the X-ray photon interactions are discriminated by comparing the energy of the X-ray photon interaction with a predetermined upper threshold value and a predetermined lower threshold value. In one embodiment, this information is communicated to computing system 130 via output signals 135 for further processing and storage.

In a further aspect, a T-SAXS system is employed to determine properties of a specimen (e.g., structural parameter values) based on one or more diffraction orders of scattered light. As depicted in FIG. 1, metrology tool 100 includes a computing system 130 employed to acquire signals 135 generated by detector 119 and determine properties of the specimen based at least in part on the acquired signals.

In some examples, metrology based on T-SAXS involves determining the dimensions of the sample by the inverse solution of a pre-determined measurement model with the measured data. The measurement model includes a few (on the order of ten) adjustable parameters and is representative of the geometry and optical properties of the specimen and the optical properties of the measurement system. The method of inverse solve includes, but is not limited to, model based regression, tomography, machine learning, or any combination thereof. In this manner, target profile parameters are estimated by solving for values of a parameterized measurement model that minimize errors between the measured scattered x-ray intensities and modeled results.

It is desirable to perform measurements at large ranges of angle of incidence and azimuth angle to increase the precision and accuracy of measured parameter values. This approach reduces correlations among parameters by extending the number and diversity of data sets available for analysis to include a variety of large-angle, out of plane orientations. For example, in a normal orientation, T-SAXS is able to resolve the critical dimension of a feature, but is largely insensitive to sidewall angle and height of a feature. However, by collecting measurement data over a broad range of out of plane angular orientations, the sidewall angle and height of a feature can be resolved. In other examples, measurements performed at large ranges of angle of incidence and azimuth angle provide sufficient resolution and depth of penetration to characterize high aspect ratio structures through their entire depth.

Measurements of the intensity of diffracted radiation as a function of x-ray incidence angle relative to the wafer surface normal are collected. Information contained in the multiple diffraction orders is typically unique between each model parameter under consideration. Thus, x-ray scattering yields estimation results for values of parameters of interest with small errors and reduced parameter correlation.

Figure 4:
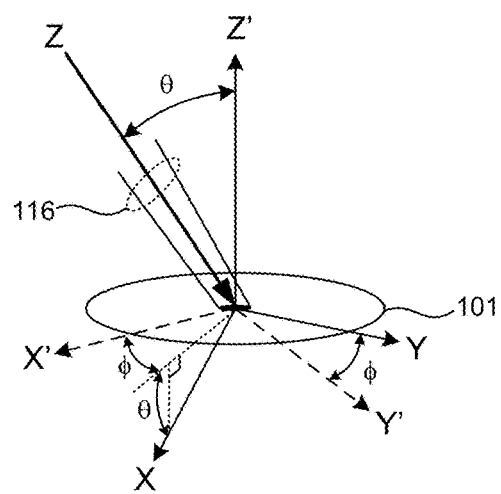
FIG. 4 depicts x-ray illumination beam 116 incident on wafer 101 at a particular orientation described by angles φ and θ.

Each orientation of the illuminating x-ray beam 116 relative to the surface normal of a semiconductor wafer 101 is described by any two angular rotations of wafer 101 with respect to the x-ray illumination beam 115, or vice-versa. In one example, the orientation can be described with respect to a coordinate system fixed to the wafer. FIG. 4 depicts x-ray illumination beam 116 incident on wafer 101 at a particular orientation described by an angle of incidence, θ, and an azimuth angle, φ. Coordinate frame XYZ is fixed to the metrology system (e.g., illumination beam 116) and coordinate frame X'Y'Z' is fixed to wafer 101. The Y axis is aligned in plane with the surface of wafer 101. X and Z are not aligned with the surface of wafer 101. Z' is aligned with an axis normal to the surface of wafer 101, and X' and Y' are in a plane aligned with the surface of wafer 101. As depicted in FIG. 4, x-ray illumination beam 116 is aligned with the Z-axis and thus lies within the XZ plane. Angle of incidence, θ, describes the orientation of the x-ray illumination beam 116 with respect to the surface normal of the wafer in the XZ plane. Furthermore, azimuth angle, φ, describes the orientation of the XZ plane with respect to the X'Z' plane. Together, θ and φ, uniquely define the orientation of the x-ray illumination beam 116 with respect to the surface of wafer 101. In this example, the orientation of the x-ray illumination beam with respect to the surface of wafer 101 is described by a rotation about an axis normal to the surface of wafer 101 (i.e., Z' axis) and a rotation about an axis aligned with the surface of wafer 101 (i.e., Y axis). In some other examples, the orientation of the x-ray illumination beam with respect to the surface of wafer 101 is described by a rotation about a first axis aligned with the surface of wafer 101 and another axis aligned with the surface of wafer 101 and perpendicular to the first axis.

In one aspect, metrology tool 100 includes a specimen positioning system 140 configured to locate a wafer vertically (i.e., plane of the wafer surface approximately aligned with the gravity vector) and actively position specimen 101 in six degrees of freedom with respect to illumination beam 116. In addition, specimen positioning system 101 is configured to align specimen 101 and orient specimen 101 over a large range of angles of incidence (e.g., at least 70 degrees) and azimuth angle (e.g., at least 190 degrees) with respect the illumination beam 116. In some embodiments, specimen positioning system 140 is configured to rotate specimen 101 over a large range of angles of rotation (e.g., at least 70 degrees) aligned in-plane with the surface of specimen 101. In this manner, angle resolved measurements of specimen 101 are collected by metrology system 100 over any number of locations and orientations on the surface of specimen 101. In one example, computing system 130 communicates command signals (not shown) to specimen positioning system 140 that indicate the desired position of specimen 101. In response, specimen positioning system 140 generates command signals to the various actuators of specimen positioning system 140 to achieve the desired positioning of specimen 101.

Figure 5:
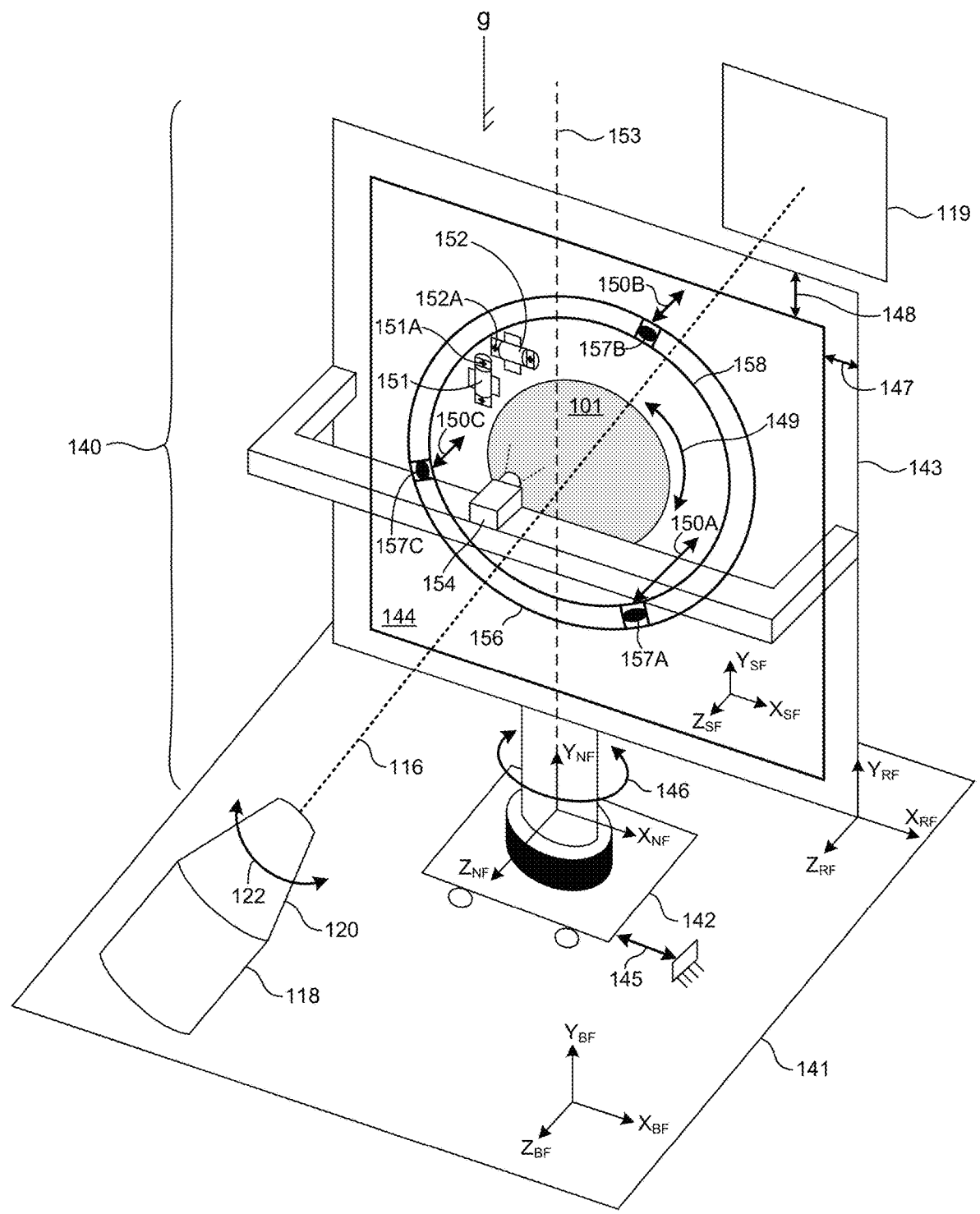
FIG. 5 is a diagram illustrative of a specimen positioning system 140 with the wafer stage moved to a position where the illumination beam 116 is incident on wafer 101.

FIG. 5 depicts a specimen positioning system 140 in one embodiment. In one aspect, specimen positioning system 140 provides active control of the position of wafer 101 with respect to illumination beam 116 in all six degrees of freedom while supporting wafer 101 vertically with respect to the gravity vector (i.e., the gravity vector is approximately in-plane with the wafer surface). Specimen positioning system 140 supports wafer 101 at the edges of wafer 101 allowing illumination beam 116 to transmit through wafer 101 over any portion of the active area of wafer 101 without remounting wafer 101. By supporting wafer 101 vertically at its edges, gravity induced sag of wafer 101 is effectively mitigated.

As depicted in FIG. 5, specimen positioning system 140 includes a base frame 141, a lateral alignment stage 142, a stage reference frame 143, and a wafer stage 144 mounted to stage reference frame 143. For reference purposes, the $\{X_{BF}, Y_{BF}, Z_{BF}\}$ coordinate frame is attached to base frame 141, the $\{X_{NF}, Y_{NF}, Z_{NF}\}$ coordinate frame is attached to lateral alignment stage 142, the $\{X_{RF}, Y_{RF}, Z_{RF}\}$ coordinate frame is attached to stage reference frame 143, and the $\{X_{SF}, Y_{SF}, Z_{SF}\}$ coordinate frame is attached to wafer stage 144. Wafer 101 is supported on wafer stage 144 by a tip-tilt-Z stage 156 including actuators 150A-C. A rotary stage 158 mounted to tip-tilt-Z stage 156 orients wafer 101 over a range of azimuth angles, φ, with respect to illumination beam 116. In the depicted embodiment, three linear actuators 150A-C are mounted to the wafer stage 144 and support rotary stage 158, which, in turn, supports wafer 101.

Actuator 145 translates the lateral alignment stage 142 with respect to the base frame 141 along the $X_{BF}$ axis. Rotary actuator 146 rotates the stage reference frame 143 with respect to lateral alignment stage 142 about an axis of rotation 153 aligned with the $Y_{NF}$ axis. Rotary actuator 146 orients wafer 101 over a range of angles of incidence, θ, with respect to illumination beam 116. Wafer stage actuators 147 and 148 translate the wafer stage 144 with respect to the stage reference frame 143 along the $X_{RF}$ and $Y_{RF}$ axes, respectively.

In one aspect, wafer stage 144 is an open aperture, two-axis (XY) linear stacked stage. The open aperture allows the measurement beam to transmit through any portion of the entire wafer (e.g., 300 millimeter wafer). The wafer stage 144 is arranged such that the Y-axis stage extends in a direction approximately parallel to the axis of rotation 153. Furthermore, the Y-axis stage extends in a direction that is approximately aligned with the gravity vector.

Actuators 150A-C operate in coordination to translate the rotary stage 158 and wafer 101 with respect to the wafer stage 144 in the $Z_{SF}$ direction and tip and tilt rotary stage 158 and wafer 101 with respect to the wafer stage 144 about axes coplanar with the $X_{SF}$-$Y_{SF}$ plane. Rotary stage 158 rotates wafer 101 about an axis normal to the surface of wafer 101. In a further aspect, a frame of rotary stage 158 is coupled to actuators 150A-C by a kinematic mounting system including kinematic mounting elements 157A-C, respectively. In one example, each kinematic mounting element 157A-C includes a sphere attached to a corresponding actuator and a V-shaped slot attached to rotary stage 158. Each sphere makes a two point contact with a corresponding V-shaped slot. Each kinematic mounting element constrains the motion of rotary stage 158 with respect to actuators 150A-C in two degrees of freedom and collectively, the three kinematic mounting elements 157A-C constrain the motion of rotary stage 158 with respect to actuators 150A-C in six degrees of freedom. Each kinematic coupling element is preloaded to ensure that the sphere remains in contact with the corresponding V-shaped slot at all times. In some embodiments, the preload is provided by gravity, a mechanical spring mechanism, or a combination thereof.

In another further aspect, rotary stage 158 is an open aperture, rotary stage. The open aperture allows the measurement beam to transmit through any portion of the entire wafer (e.g., 300 millimeter wafer). The rotary stage 158 is arranged such that its axis of rotation is approximately perpendicular to the axis of rotation 153. Furthermore, the axis of rotation of the rotary stage 158 is approximately perpendicular to the gravity vector. The wafer 101 is secured to the rotary stage 158 via edge grippers to provide full wafer coverage with minimal edge exclusion.

In summary, specimen positioning system 140 is capable of actively controlling the position of wafer 101 in six degrees of freedom with respect to the illumination beam 116 such that illumination beam 116 may be incident at any location on the surface of wafer 101 (i.e., at least 300 millimeter range in $X_{RF}$ and $Y_{RF}$ directions). Rotary actuator 146 is capable of rotating the stage reference frame 143 with respect to the illumination beam 116 such that illumination beam 116 may be incident at the surface of wafer 101 at any of a large range of angles of incidence (e.g., greater than two degrees). In one embodiment, rotary actuator 146 is configured to rotate stage reference frame 143 over a range of at least sixty degrees. Rotary actuator 158 mounted to wafer stage 144 is capable of rotating the wafer 101 with respect to the illumination beam 116 such that illumination beam 116 may be incident at the surface of wafer 101 at any of a large range of azimuth angles (e.g., at least ninety degrees rotational range). In some embodiments, the range of azimuth angles is at least one hundred ninety degrees rotational range.

In some other embodiments, lateral alignment stage 142 is removed and stage reference frame 143 is rotated with respect to base frame 141 by rotary actuator 146. In these embodiments, the x-ray illumination system includes one or more actuators that move one or more optical elements of the x-ray illumination system that cause the x-ray illumination beam 116 to move with respect to the base frame 141, for example, in the $X_{BF}$ direction. In these embodiments, movements of stage reference stage 143 for purposes of calibration as described herein are replaced by movements of one or more optical elements of the x-ray illumination system move the x-ray illumination beam to the desired position with respect to the axis of rotation 153, for example. In the embodiments depicted in FIG. 1 and FIG. 21, computing system 130 communicates command signals 138 to actuator subsystem 111' to redirect the x-ray emission relative to base frame 141 to achieve a desired beam direction by moving one or more elements of x-ray illumination subsystem 125. In the depicted embodiment, actuator subsystem 111' moves focusing optics 111 to redirect the x-ray emission relative to base frame 141, and thus relocate the x-ray emission relative to the axis of rotation 153.

Figure 6:
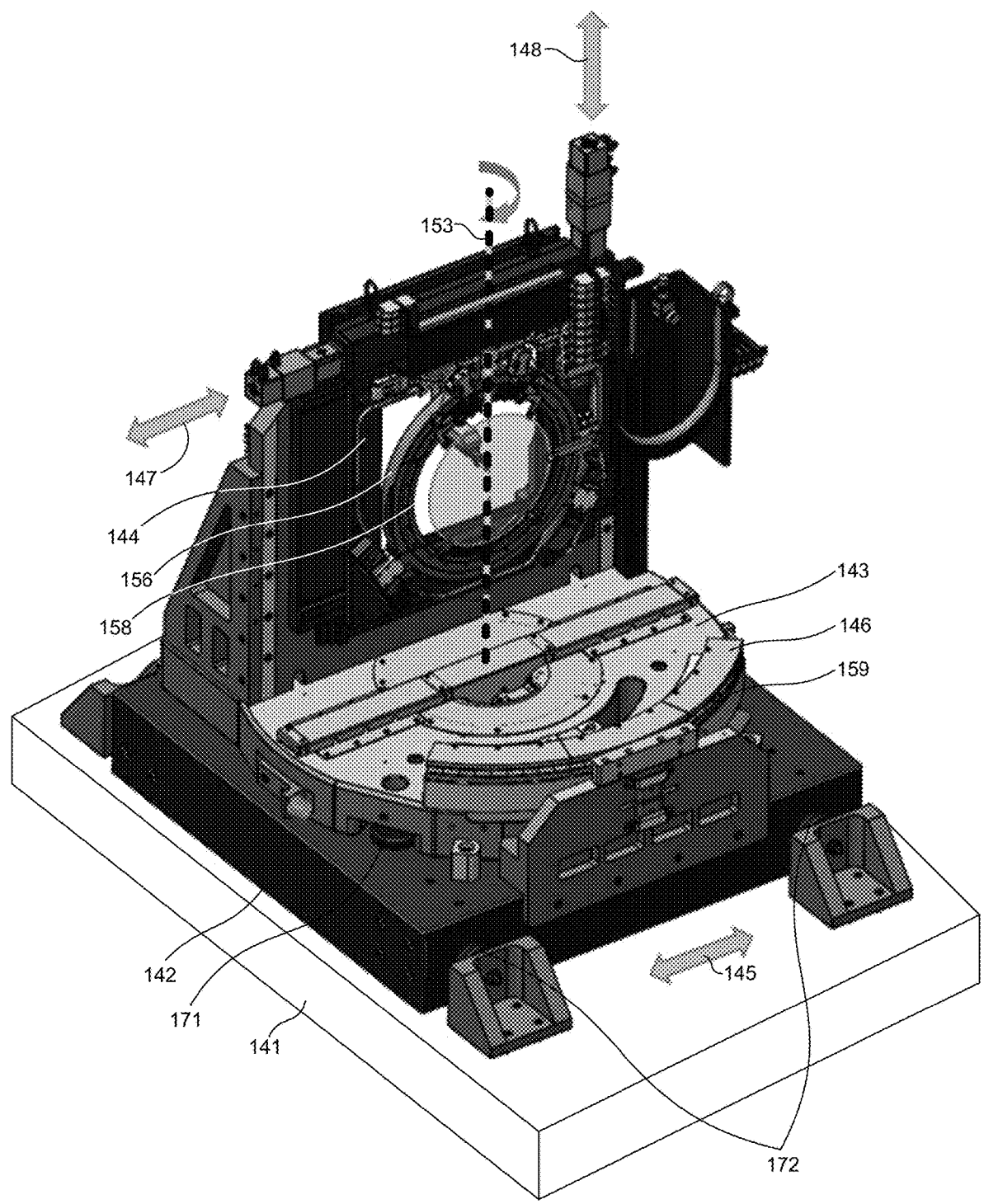
FIG. 6 is a diagram illustrative of specimen positioning system 140 with additional details.

FIG. 6 depicts another illustration of specimen positioning system 140 in greater detail. Like numbered elements depicted in FIG. 6 are analogous to those described with reference to FIG. 5. As depicted in FIG. 5, rotary actuator 146 rotates a large mass including stage reference frame 143, wafer stage 144, tip-tilt-Z stage 156, and rotary stage 158 about the axis of rotation 153. As depicted in FIG. 6, wafer stage 144, tip-tilt-Z stage 156, and rotary stage 158 is offset from the axis of rotation 153 by a significant distance.

In a further aspect, counterweight 159 is mounted to stage reference frame 143 to counterbalance wafer stage 144, tip-tilt-Z stage 156, and rotary stage 158, etc., such that the center of gravity of the rotating mass of the stage reference frame 143 and all mounted components is approximately aligned with the axis of rotation 153. In this manner, force exerted by actuator 146 generates a torque about the axis of rotation 153 with a minimum of parasitic linear forces.

As depicted in FIG. 6, air bearings 172 are employed to guide the movement of lateral alignment stage 142 with respect to base frame 141. Similarly, air bearings 171 are employed to guide the movement of stage reference frame 143 with respect to lateral alignment stage 142. Air bearings operating on precision granite surfaces minimize static friction and provide axis stability. This improves positioning performance (i.e., high repeatability and small settling times) while supporting large loads.

To insure that the location of intersection of the illumination beam 116 with the surface of wafer 101 does not change over a large range of angles of incidence, axis of rotation 153 must have very small synchronous and asynchronous errors. In addition, any Abbe errors must be minimized. To minimize Abbe errors, air bearings 171 are equally spaced radially about the axis of rotation 153. The bearing circle is large enough to prevent large angular errors. The bearings are constrained vertically by the surface of lateral alignment stage 142. In some embodiments, the surface of lateral alignment stage 142 is a precision ground granite surface that is perpendicular to the axis of rotation 153.

In general, the specimen positioning system provides automated positioning of semiconductor wafers in six degrees of freedom. In addition, the specimen positioning system includes edge gripping features and actuators on the rotary stage to effectively load and unload the wafer in the vertical position in coordination with a wafer handling robot.

In some embodiments, three sensors are disposed on the specimen positioning system to measure the distance of the backside of the wafer with respect to the specimen positioning system. In this manner, the wafer bow is measured and compensated by movement of the wafer using the tip-tilt-Z stage.

In another aspect, a SAXS metrology system employs at least one beam occlusion calibration target to locate an x-ray illumination beam with respect to the specimen positioning system. The beam occlusion calibration target includes at least one marker and a cylindrically shaped occlusion element. An alignment camera is employed to locate the marker in coordinates of the specimen positioning system. The location of the marker with respect to the cylindrically shaped occlusion element is known apriori (e.g., with an accuracy of less than 200 nanometers). Thus, the location of the cylindrically shaped occlusion element in coordinates of the specimen positioning system is easily determined by a straightforward coordinate transformation. The cylindrically shaped occlusion element is scanned across the illumination beam while the detected intensity of the transmitted flux is measured. The center of the illumination beam is precisely located with respect to the cylindrically shaped occlusion element based on the measured intensity. Since the location of the cylindrically shaped occlusion element is known in the coordinates of the specimen positioning system, the location of center of the illumination beam in the coordinates of the specimen positioning system is precisely located by simple coordinate transformation.

In some examples, a beam occlusion calibration target is employed to calibrate the location of incidence of the illumination beam with respect to the specimen positioning system. In some other examples, a beam occlusion calibration target is employed to align the axis of rotation of the stage reference frame with respect to the illumination beam at the point of incidence of illumination beam with a wafer.

Figure 7:
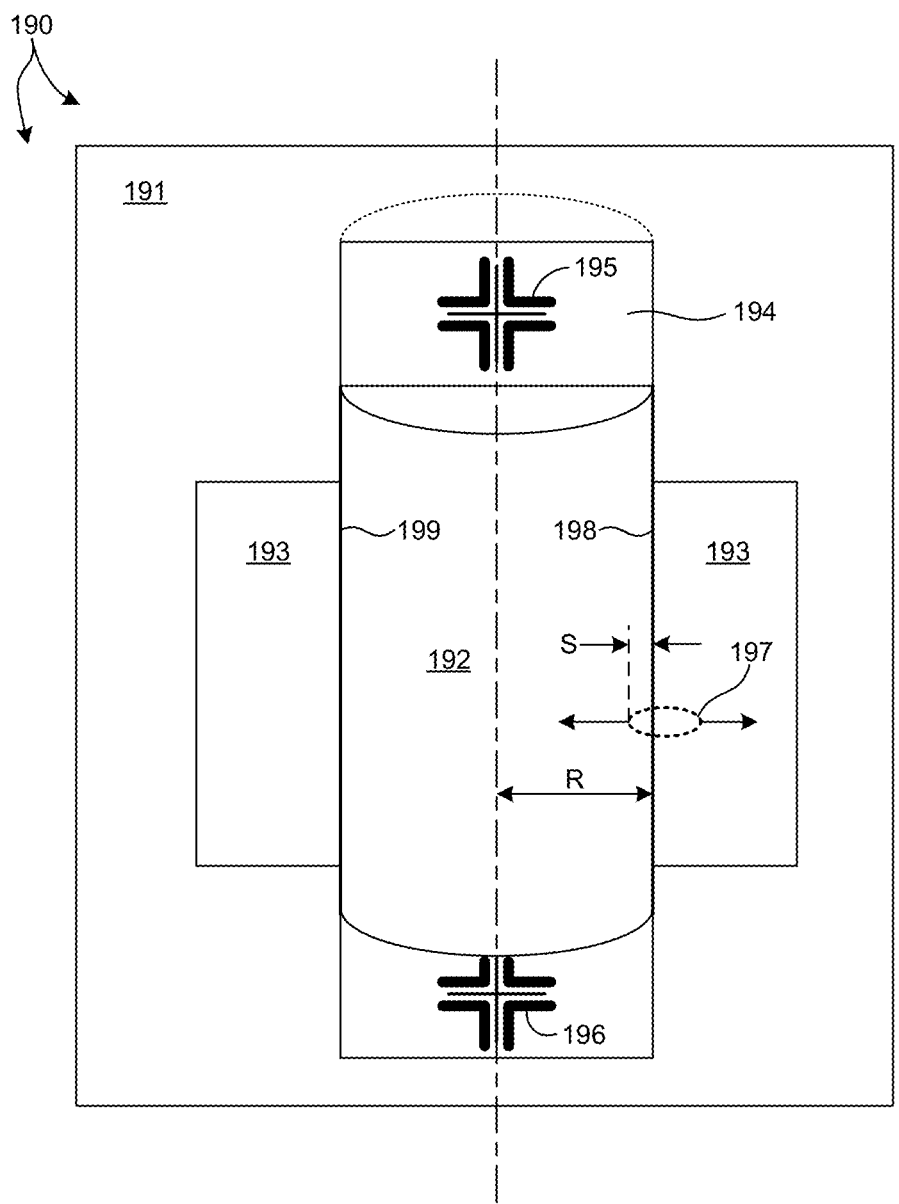
FIG. 7 depicts a beam occlusion calibration target 190 in one embodiment.

FIG. 7 depicts a beam occlusion calibration target 190 in one embodiment. In the embodiment depicted in FIG. 7, beam occlusion calibration target 190 includes a precision shaped cylindrical pin 192 and a frame 191 that supports cylindrical pin 192. Cylindrical pin 192 is fabricated with high surface quality and precise dimensions on the order of target uncertainty (e.g., tolerances less than 0.5 micrometers).

In some embodiments, frame 191 may be a structure that is mounted to a specimen positioning system such as specimen positioning system 140. In these embodiments, beam occlusion calibration target 190 is mounted to specimen positioning system 140, rather than a calibration wafer. In some other embodiments, frame 191 may be a specialized calibration wafer that includes one or more cylindrical pins attached to the wafer itself. In these embodiments, beam occlusion calibration target 190 is mounted to a calibration wafer. Beam occlusion calibration target 190 also includes openings 193 on one or both sides of cylindrical pin 192. The openings 193 are sized such that the illumination beam (e.g., illumination beam 197) is able to pass through beam occlusion calibration target 190 without occlusion (e.g., at least 2 millimeters by 2 millimeters). Beam occlusion calibration target 190 also includes one or more markers (e.g., markers 195 and 196) readable by an optical microscope mounted to the specimen positioning system. The location of markers 195 and 196 with respect to the edges 198 and 199 of cylindrical pin are known precisely. In this manner, the location of the edges of cylindrical pin 192 are determined by simple coordinate transformation from the location of either marker 195 and 196, or both.

A cylindrical pin shaped occlusion element largely eliminates the problem of finite transparency that arises when employing a knife edge as an alignment target. The beam path through cylindrical pin is defined by the radius of the cylinder, R, and depth of impingement of the beam path relative to the edge of the cylindrical pin, S. When R is significantly larger than S, the length of the beam path, L, through the cylindrical pin is approximated by equation (1).

$$L=2\sqrt{2RS} \qquad (1)$$

When employing a tungsten carbide cylindrical pin of approximately 2 millimeters diameter, the uncertainty in edge position for hard X-rays due to semi-transparency is less than one micrometer. In general, cylindrical pin 192 may be manufactured from any suitably dense, high atomic number material. By way of non-limiting example, cylindrical pin 192 may be constructed from tungsten carbide, tungsten, platinum, etc. The diameter of the cylindrical pin should be sufficiently large such that the induced uncertainty of the edge position due to semi-transparency of the material is well within the total alignment error budget. Typically, a diameter of 2-3 millimeters is sufficient to maintain the induced uncertainty of the edge position due to semi-transparency of the material below one to two micrometers.

As depicted in FIG. 7, beam occlusion calibration target 190 includes one or more flat surfaces (e.g., flat surface 194) that are accurately aligned with the axis of cylindrical pin 192. In some examples, the surface 194 is a reference surface for measurement of the target position in the direction collinear with the X-ray beam axis by a distance sensor (e.g., capacitive probe, inductive probe, etc.). In addition, in some embodiments, one or more markers are located on the flat surface. For example, as depicted in FIG. 7, marker 195 is located on the flat surface 194.

In the embodiment depicted in FIG. 5, beam occlusion calibration targets 151 and 152 are mounted to the frame of rotary stage 158 such that the central axis of the cylindrical pins are approximately co-planar with the surface of wafer 101. As depicted in FIG. 5, cylindrical pin 151 includes a central axis approximately aligned parallel with the $Y_{NF}$ axis and cylindrical pin 152 includes a central axis approximately aligned parallel with the $X_{RF}$ axis. Each cylindrical pin occludes the beam by absorption of a large fraction of any impinging x-rays.

Specimen positioning system 140 also includes an alignment camera 154 mounted to stage reference frame 143. In the depicted embodiment, the alignment camera is mounted to the stage reference frame, and thus rotates with the stage reference frame. Alignment camera 154 is configured to generate high resolution images of objects in its field of view, such as wafer 101. In some embodiments, alignment camera 154 also includes an auto-focus mechanism that maintains a sharp image focus by precisely moving the focal point of the camera by a measured distance. In some of these embodiments, alignment camera 154 can be used to measure relative distances between the stage reference frame to which the camera body is mounted and wafer 101 or markers 151A and 152A imaged by the camera by monitoring the z-displacement of the focal point of the camera.

In some other embodiments, an alignment camera is mounted to lateral alignment stage 142. In some of these embodiments, the alignment camera is used to measure relative distances between the $\{X_{NF}, Y_{NF}, Z_{NF}\}$ coordinate frame to which the camera body is mounted and wafer 101 or markers 151A and 152A imaged by the camera by monitoring the location of optical markers mounted to wafer 101 or markers 151A and 152A within the field of view of the alignment camera.

In one further aspect, the precise location of incidence of the illumination beam in two dimensions in the plane of the surface of the wafer is determined based on the interaction of the illumination beam with two or more beam occlusion calibration targets.

Figure 9:
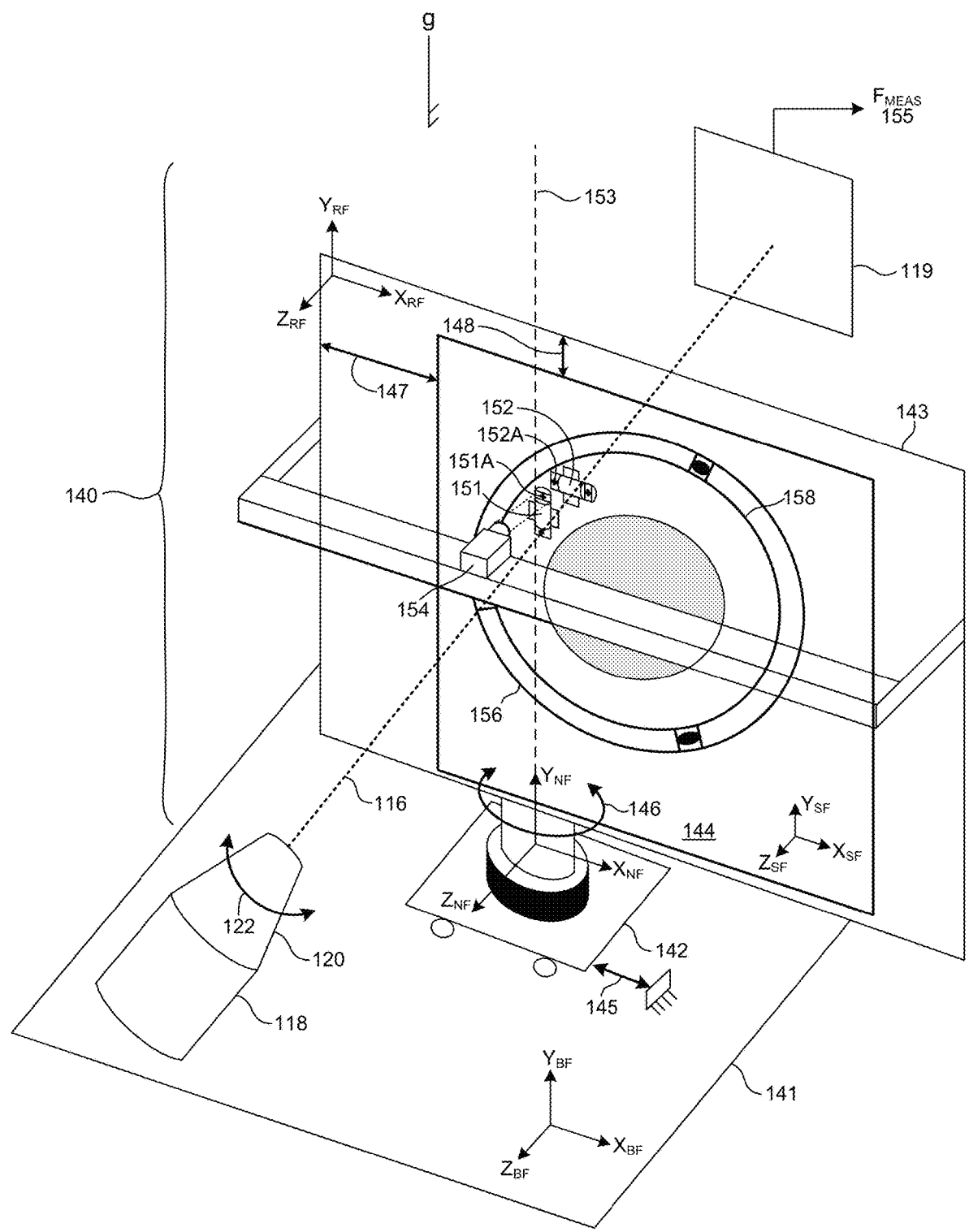
FIG. 9 is a diagram illustrative of the specimen positioning system 140 with the wafer stage moved to a position where the illumination beam 116 is occluded by a cylindrical pin element 151.

FIG. 9 is a diagram illustrative of the specimen positioning system 140 with the wafer stage moved to a position where the illumination beam 116 is occluded by the cylindrical pin element 151. The precise location of incidence of the illumination beam with respect to cylindrical pin 151 is determined based on transmitted flux measured by detector 119 as a function of the X position of cylindrical pin 151 with respect to illumination beam 116 (i.e., base frame 141). As depicted in FIG. 9, as cylindrical pin 151 is moved in the positive X-direction (in the direction of $X_{BF}$), more and more of illumination beam 116 is occluded by cylindrical pin 151. As a result fewer photons reach detector 119. However, as cylindrical pin 151 is moved in the negative X-direction (opposite $X_{BF}$), less and less of illumination beam 116 is occluded by cylindrical pin 151. Detector 119 generates signals 155 indicative of the measured flux as a function of X-position and the results are analyzed to identify the position of the cylindrical pin that corresponds with the center of illumination beam 116.

Figure 10:
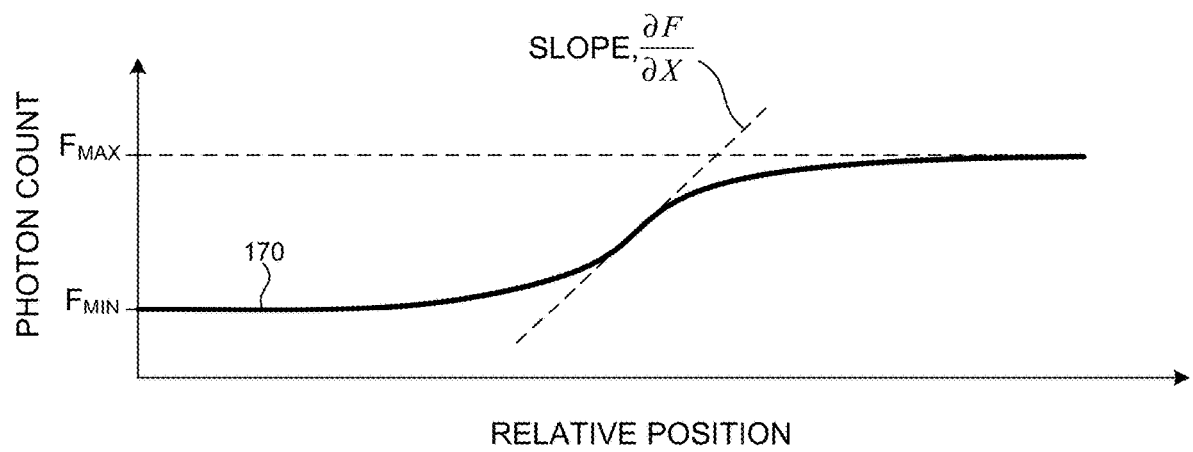
FIG. 10 depicts a plot 170 illustrative of measured flux as a function of relative position of a cylindrical pin with respect to illumination beam 116.

FIG. 10 depicts a plot 170 illustrative of measured flux as a function of relative position of a cylindrical pin with respect to illumination beam 116. The depicted relationship between measured flux 155 and relative position is a sigmoid type function (e.g., logistic or other error function depending on the beam profile).

In some examples, the beam center is determined to be the relative position of the cylindrical pin with respect to the illumination beam where the measured flux is halfway between the minimum flux value, $F_{MIN}$, and the maximum flux value, $F_{MAX}$, or the maximum value of the derivative, dF/dx. However, in some other examples, the beam center may be determined at another flux value different from the middle of the range of measured flux. In some examples, a more precise relationship is determined by modeling of the interaction of the beam with the material and geometry of the cylindrical pin. In these examples, the modelled interaction is compared with the measured transmitted flux, and a fitting algorithm is used to determine the relative position of the cylindrical pin with respect to the illumination beam that aligns with the beam center based on the fit of the measured results to the model.

In one example, an estimate of the distance, AX, between a current position of cylindrical pin 151 with respect to the center of illumination beam 116 and a position of the cylindrical pin 151 that coincides with the beam center is based on the measured flux, $F_{MEAS}$, the mid-point of the flux, $F_{MID}$, and the inverse of the derivative of the measured flux as a function of cylindrical pin position as described by equation (2)

$$\Delta X = \frac{\partial X}{\partial F}(F_{MEAS} - F_{MID}) \quad (2)$$

and $F_{MID}$ is described by equation (3).

$$F_{MID} = \frac{F_{MIN} + F_{MAX}}{2} \quad (3)$$

The maximum and minimum values of measured flux can be measured by scanning the wafer stage while measuring transmitted flux. Furthermore, the slope at the mid-point can also be estimated. Based on these quantities, an estimate of the change in centered position of the cylindrical pin is determined in accordance with equation (2) simply by measuring flux at one position. If necessary, the change in centered position can be determined iteratively to converge on a centered position.

Since the beam has a centroid component in two directions (e.g., X and Y directions), two cylindrical pins each oriented perpendicular to the direction of the centroid component are measured. In the embodiment depicted in FIG. 9, cylindrical pin 151 is employed to locate the beam center with respect to the stage reference frame in the X-direction and cylindrical pin 152 is employed to locate the beam center with respect to the stage reference frame in the Y-direction. In general, more than two cylindrical pins may be utilized to generate redundancy and increase the accuracy of the calibration of the beam location.

As depicted in FIG. 9, the center of the illumination beam 116 is aligned with the edges of the vertically and horizontally oriented cylindrical pins 151 and 152 as described hereinbefore. In the embodiment depicted in FIG. 9, a fiducial mark 151A is located co-planar with the central axis of cylindrical pin 151. Similarly, a fiducial mark 152A is located co-planar with the central axis of cylindrical pin 152. At the location of beam center alignment with cylindrical pin 151, the position of the illumination beam 116 with respect to cylindrical pin 151, or fiducial 151A at or near the cylindrical pin, is recorded by alignment camera 154. This registers the relative position of the illumination beam with respect to a precise location in the field of view of the alignment camera (assuming no change in focus position). As depicted in FIG. 5, wafer 101 is moved within the field of view of alignment camera 154. Wafer 101 is moved such that a desired location (e.g., a fiducial mark) on the wafer is imaged within the field of view of alignment camera 154. The position of the illumination beam 116 with respect to the desired location is determined by alignment camera 154 based on the previous registration. In this manner, the position of the illumination beam 116 on wafer 101 in the X and Y direction is quickly estimated based on an image collected by the alignment camera 154. In some embodiments, the position of the wafer in the Z-direction with respect to the Z-location of cylindrical pin 151 is measured by changing the focus position of alignment camera 154 until the lithographic features on the surface of wafer 101 come into precise focus. The change is focus position is indicative of the difference in Z-position between the cylindrical pin and the imaged location on the wafer. In some other embodiments, the position of the wafer in the Z-direction with respect to the Z-location of cylindrical pin 151 is measured by one or more optical proximity sensors, capacitive proximity sensors, interferometry based sensors, or other suitable proximity sensors. Actuators 150A-C may be employed to reposition wafer 101 in the Z-direction to relocate the imaged location to be in plane with the cylindrical pin (e.g. fiducial 151A).

In a further aspect, the position of incidence of the illumination beam is determined at any location on the wafer based on wafer stage coordinates. Once the center of the illumination beam is aligned with the vertical and horizontal cylindrical pins, and the position of the illumination beam with respect to the cylindrical pin is recorded by an alignment camera as described hereinbefore, the location of incidence of the illumination beam can be transferred to stage coordinates. As depicted in FIG. 5, wafer 101 is moved within the field of view of alignment camera 154. The movement of wafer 101 is measured by the position measurement system of wafer stage 144 (e.g., linear encoders, etc.) By moving wafer 101 to three or more desired locations (e.g., a fiducial marks) on the wafer imaged within the field of view of alignment camera 154, the position of the illumination beam with respect to the desired location is determined at each desired location, along with the position of the wafer in stage coordinates. Based on the known location of the illumination beam and stage coordinates at the three or more locations, a map is generated that relates stage coordinates to the location of incidence of the illumination beam.

After locating the cylindrical pin 151 at the center of illumination beam 116 (in the X-direction), alignment camera 154 images the location of the cylindrical pin itself, or a fiducial mark located on or near the cylindrical pin, to establish a relationship between beam location and image location within the field of view of alignment camera 154. Since alignment camera 154 is located in a fixed, or repeatable, position with respect to the stage reference frame 143, the image registers the location of the illumination beam with respect to the stage reference frame 143, and thus serves as a reference for beam location in the X-direction. Moreover, alignment camera 154 establishes a precise focus position of the fiducial mark, to establish a precise Z-location of the cylindrical pin with respect to stage reference frame 143. For embodiments where the alignment camera 154 rotates with the stage reference frame, the focus position of the alignment camera 154 serves as a reference for Z-position of the cylindrical pin with respect to the stage reference frame.

Since occluded flux is utilized to estimate the location of beam incidence, there is a risk that changes in flux in the illumination beam will be interpreted as a shift in position. In some embodiments, the flux of the illumination beam is measured immediately before, after, or simultaneously with the occlusion measurements. Variations in illumination flux are compensated in analysis of the measured flux 155 to eliminate their influence on the measurement.

In another aspect, the precise alignment of the axis of rotation 153 with the illumination beam in the plane of the surface of the wafer is determined based on the interaction of the illumination beam with two or more beam occlusion calibration targets as measured by the x-ray detector 119.

To ensure measurement integrity, the location of incidence of illumination beam 116 on the surface of wafer 101 should remain stationary during measurements over a large range of angles of incidence and azimuth angles. To achieve this objective, the axis of rotation 153 of stage reference frame 143 must be approximately co-planar with the surface of wafer 101 at the measurement location. Furthermore, the axis of rotation 153 must be aligned with the illumination beam 116 in the $X_{BF}$ direction such that the axis of rotation 153 intersects the illumination beam 116 at the point of incidence of illumination beam 116 with wafer 101 at the measurement location.

Figure 8A:
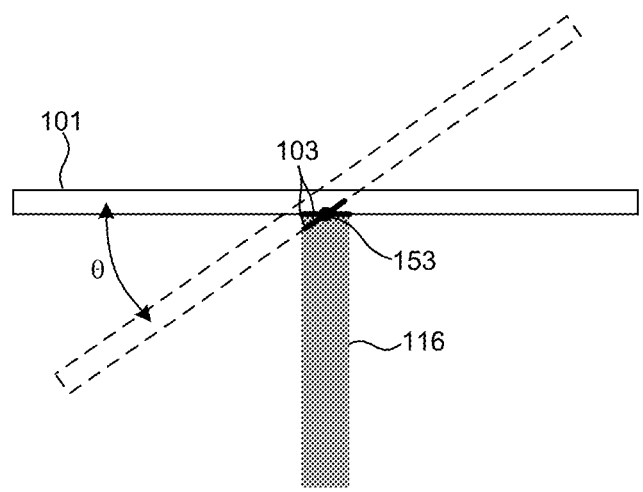
FIG. 8A depicts a top view of illumination beam 116 incident on wafer 101 as depicted in FIG. 5 where the rotational axis 153 intersects the illumination beam 116 at the point of incidence of illumination beam 116 with wafer 101.

FIG. 8A depicts a top view of illumination beam 116 incident on wafer 101 as depicted in FIG. 5. FIG. 8A depicts an end view of rotational axis 153 in a state of alignment where rotational axis 153 intersects the illumination beam 116 at the point of incidence of illumination beam 116 with wafer 101 at location 103 on wafer 101. As depicted in FIG. 8A, as wafer 101 is rotated about rotational axis 153 over a large angle of incidence, θ, illumination beam 116 remains incident at location 103. Thus, in this scenario, the location of incidence of illumination beam 116 on the surface of wafer 101 remains stationary during measurements over a large range of angles of incidence.

Figure 8B:
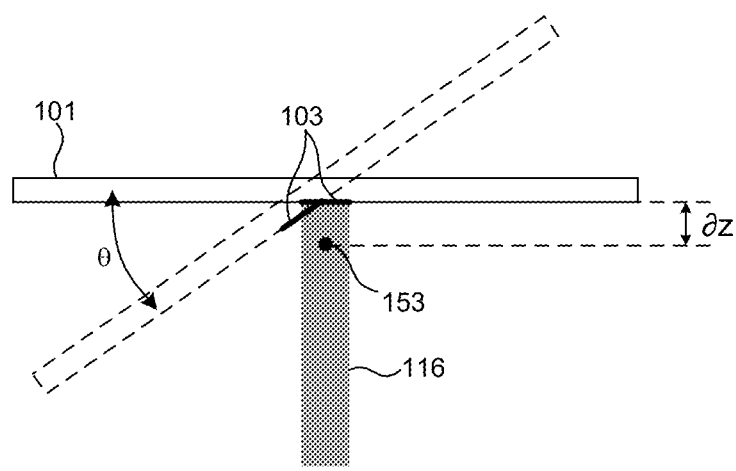
FIG. 8B depicts a top view of illumination beam 116 incident on wafer 101 as depicted in FIG. 5 where rotational axis 153 is misaligned with the surface of wafer 101 in the Z-direction.

FIG. 8B depicts a top view of illumination beam 116 incident on wafer 101 as depicted in FIG. 5. FIG. 8B depicts an end view of rotational axis 153 in a state of alignment where rotational axis 153 is misaligned with the surface of wafer 101 by a distance ∂z. As depicted in FIG. 8B, as wafer 101 is rotated about rotational axis 153 over a large angle of incidence, θ, a portion of location 103 is no longer illuminated (i.e., some other portion of wafer 101 is illuminated instead. Thus, in this scenario, the location of incidence of illumination beam 116 on the surface of wafer 101 drifts during measurements over a large range of angles of incidence, which is highly undesirable.

Figure 8C:
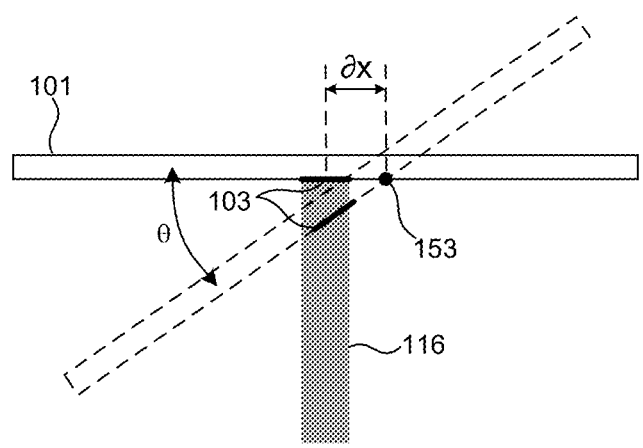
FIG. 8C depicts a top view of illumination beam 116 incident on wafer 101 as depicted in FIG. 5 where rotational axis 153 is offset from illumination beam 116 in the X-direction.

FIG. 8C depicts a top view of illumination beam 116 incident on wafer 101 as depicted in FIG. 5. FIG. 8C depicts an end view of rotational axis 153 in a state of alignment where rotational axis 153 is co-planar with the surface of wafer 101, but is offset from illumination beam 116 by a distance ∂x. As depicted in FIG. 8C, as wafer 101 is rotated about rotational axis 153 over a large angle of incidence, θ, a portion of location 103 is no longer illuminated (i.e., some other portion of wafer 101 is illuminated instead. Thus, in this scenario, the location of incidence of illumination beam 116 on the surface of wafer 101 drifts during measurements over a large range of angles of incidence, which is highly undesirable.

In some embodiments, the calibration of the axis of rotation of the stage reference frame is achieved by aligning the center of the illumination beam with the X-direction cylindrical pin 151 and measuring flux at a plurality of different rotational positions of the stage reference frame, θ. The apparent motion of the cylindrical pin in the X-direction (ΔX) is determined based on the chosen occlusion model as described hereinbefore (e.g., the sigmoid function depicted in FIG. 10, or another model). In addition, the apparent motion of the cylindrical pin in the X-direction is a function of 1) the distance of the cylindrical pin from the axis of rotation in the x-direction, ∂x, and in the z-direction, ∂z, 2) the distance from the beam center and the axis of rotation 153 in the x-direction, ∂n, and 3) the rotation angle about the axis of rotation 153 of the stage reference frame, θ. The relationship is described in equation (4).

$$\Delta X = \partial x \cos \theta + \partial z \sin \theta + \partial n \quad (4)$$

In one example, transmitted flux is measured at three angles of incidence, $\{-\Theta, 0, +\Theta\}$. A linear system of equations described by equation (5) results from equation (4).

$$\begin{bmatrix} \Delta X_+ \\ \Delta X_0 \\ \Delta X_- \end{bmatrix} = \begin{bmatrix} 1 & \cos\Theta & \sin\Theta \\ 1 & 1 & 0 \\ 1 & \cos\Theta & -\sin\Theta \end{bmatrix} \begin{bmatrix} \partial n \\ \partial x \\ \partial z \end{bmatrix} = A_\Theta \begin{bmatrix} \partial n \\ \partial x \\ \partial z \end{bmatrix} \quad (5)$$

Equation (6) is obtained by inverting equation (5). Equation (6) solves for values of ∂n, ∂x, and ∂z from the apparent motion of the cylindrical pin in the X-direction.

$$\begin{bmatrix} \partial n \\ \partial x \\ \partial z \end{bmatrix} = \frac{1}{2(\cos\Theta - 1)} \begin{bmatrix} -1 & 2\cos\Theta & -1 \\ 1 & -2 & 1 \\ \frac{(\cos\Theta - 1)}{\sin\Theta} & 0 & -\frac{(\cos\Theta - 1)}{\sin\Theta} \end{bmatrix} \begin{bmatrix} \Delta X_+ \\ \Delta X_0 \\ \Delta X_- \end{bmatrix} = A_\Theta^{-1} \Delta_X \quad (6)$$

Equation (6) combined with equation (3) solves for values of ∂n, ∂x, and ∂z from the apparent motion of the cylindrical pin in the X-direction determined from measured flux. In some examples, the solution for values of is ∂n, ∂x, and ∂z is obtained iteratively as described by equation (7).

$$w_{k+1} = w_k + \frac{\partial X}{\partial F} A_\Theta^{-1} \begin{bmatrix} F_+ - F_{MID} \\ F_0 - F_{MID} \\ F_- - F_{MID} \end{bmatrix}, \text{ where} \quad (7)$$

where k is the iteration index and w is the vector [∂n, ∂x, and ∂z] of the values of the displacements of the actuators of specimen positioning system 140 required to align the axis of rotation 153 with the knife-edge 151 in the X and Z directions. The displacement, ∂n, is realized by actuator 145 moving the entire stage reference frame 143 with respect to the illumination beam 116 in the X-direction. The displacement, ∂x, is realized by actuator 147 moving the cylindrical pin 151 back into alignment with the beam. The displacement, ∂z, is realized by actuators 150A-C moving the cylindrical pin in the Z-direction to align the axis of rotation 153 in plane with the central axis of the cylindrical pin in the Z-direction. Starting at an initial estimate, $w_0$, the recursion of equation (7) will converge to a point where the axis of rotation 153 is aligned to the cylindrical pin 151.

In general, equation (7) does not need to be applied exactly. The values of $A_\Theta$ and ∂x/∂F may be approximated numerically. In other examples, other matrices may be used, provided the iteration is stable and converges to the correct value.

In general, transmitted flux may be measured at any three or more different angles of incidence to determine values of displacements required to align the axis of rotation 153 with the cylindrical pin 151 in the X and Z directions. The selection of any three different angles of incidence results in a linear of system of equations that can be directly inverted. The selection of four of more different angles of incidence results in an overdetermined linear system of equations that can be solved with a pseudoinverse algorithm to determine values of displacements required to align the axis of rotation 153 with the cylindrical pin 151 in the X and Z directions. The terms of the matrices illustrated in equations (5) and (6) depend on the selected angles of incidence. Thus, the terms will differ from equations (5) and (6) in examples where different angles of incidence are selected.

In another aspect, the precise alignment of the axis of rotation 153 with a marker of a calibration target (e.g., marker 151A of beam occlusion calibration target 151, marker located on wafer 101, etc.) in the plane of the surface of the wafer is determined based on images of the marker collected by an alignment camera mounted to lateral alignment stage 142.

The apparent motion of the marker in the X-direction ($\Delta X$) in the field of view of the alignment camera is a function of the distance of the marker from the axis of rotation in the x-direction, $\partial x$, and in the z-direction, $\partial z$, and the rotation angle about the axis of rotation 153 of the stage reference frame, $\theta$. For an alignment camera mounted to lateral alignment stage 142 the relationship is described in equation (8).

$$\Delta X = \partial x(1-\cos\theta) + \partial z(\sin\theta) \quad (8)$$

In some examples, the X-position of a marker (e.g., marker 151A) is measured at any three different angles of incidence to determine values of displacements required to align the axis of rotation 153 with the cylindrical pin 151 in the X and Z directions. The selection of any three different angles of incidence results in a linear of system of equations that can be directly inverted to solve for the distance of the marker from the axis of rotation in the x-direction, $\partial x$, and in the z-direction, $\partial z$.

For an idealized beam occlusion calibration target and axis of rotation, it would be sufficient to have only one beam occlusion calibration target for beam calibration. Depending on the requirements of the system, however, multiple beam occlusion calibration targets may be required. By aligning edges of multiple occlusion elements, it is possible to deduce any deviation of the axis of rotation from the nominal $Y_{NF}$ axis. Also, multiple identical occlusion elements allow the calibration of an edge from the right and the left, or up and down, helping eliminate systematic errors in the imaged edges (i.e., imaged by alignment camera 154) and the apparent edge deduced from the occluded flux change.

In another aspect, a SAXS metrology system employs at least one periodic calibration target to locate an x-ray illumination beam with respect to the specimen positioning system. Each periodic calibration target includes one or more spatially defined zones having different periodic structures that diffract X-ray illumination light into distinct diffraction patterns measurable by a SAXS metrology system described herein. In addition, each periodic calibration target includes one or more markers readable by an optical microscope to locate the periodic calibration target with respect the specimen positioning system with high alignment accuracy (e.g., alignment accuracy of 0.5 micrometers or less). Each spatially defined zone has spatially well-defined boundary lines. The location of the boundary lines is known relative to the markers with high accuracy in one or more dimensions (e.g., accuracy of 0.2 micrometers or less).

In some embodiments, the size of each periodic zone is designed to be larger than the projection of the illumination beam onto the periodic calibration target. In this manner, the beam profile can be characterized by scanning the illumination beam across an interface between two different periodic zones each sized larger than the illumination beam. In some embodiments, illumination beam 116 has a beam width of less than 200 micrometers. In some embodiments, illumination beam 116 has a beam width of less than 100 micrometers. In some embodiments, illumination beam 116 has a beam width of less than 50 micrometers. In addition, in some examples, calibration measurements are performed at large angles of incidence. In these examples, the projection of illumination beam onto the periodic calibration target is elongated in one direction, and each periodic zone is sized larger than the projected illumination area.

In some embodiments, the dimensions of each periodic zone differ depending on direction with respect to the illumination beam. For example, a periodic zone may be larger in a direction perpendicular to the axis of rotation 153 to accommodate a large angle of incidence. In another example, the illumination beam may be larger in one direction than another (e.g., a rectangular illumination beam shape) and a periodic zone may be larger in the elongated direction.

In some embodiments, the dimensions of one or more of the periodic zones are sized to match the required measurement box size. In one example, one of the periodic zones is sized to match the illumination beam size (e.g., 50 micrometers or 100 micrometers square) or some other number for calibration of the alignment of the axis of rotation 153 with respect to the illumination beam 116. In this example, perfect alignment is achieved when the illumination beam 116 does not move relative to the periodic calibration target over a large range of AOI. In this example, if the illumination beam moves relative to the periodic calibration target as AOI changes, the illumination beam will move from the periodic sized to match the illumination beam size to an adjacent periodic zone. This movement of the illumination beam across the boundary between zones is detected by the detector 119.

In general, a set of periodic calibration targets or set of zones of a periodic calibration target includes different sized zones useful for characterizing beam profile and size. In general, one or more zones may have sized to be larger, smaller, or the same size as the illumination beam.

In general, the periodicity of a periodic calibration target is optimized to enhance x-ray scattering contrast. The pitch of each periodic structure is small enough to ensure adequate spatial separation of the detected orders at the detector. The angle of each diffracted order should be significantly larger than the beam divergence to ensure adequate spatial separation, and the angle of each diffracted order increases as the pitch decreases. In some embodiments, the pitch of each periodic structure should be one the order of 0.1 micrometer (e.g., less than 200 nanometers) to ensure adequate spatial separation and measurement accuracy.

Each periodic structure is made of a material having high contrast with hard X-rays and large atomic number (e.g., Tungsten, Tungsten Carbide, Platinum, etc.).

In addition, each periodic structure is fabricated with sufficient height to generate a measurable diffraction pattern over a reasonable exposure time. In some examples, a periodic structure having a height of 0.5 millimeter or more is advantageous.

In some embodiments, any of the periodic calibration targets described herein is mounted to a specimen positioning system, such as specimen positioning system 140. In some other embodiments, any of the periodic calibration targets described herein is mounted to a calibration wafer or a production wafer under measurement.

Figure 11:
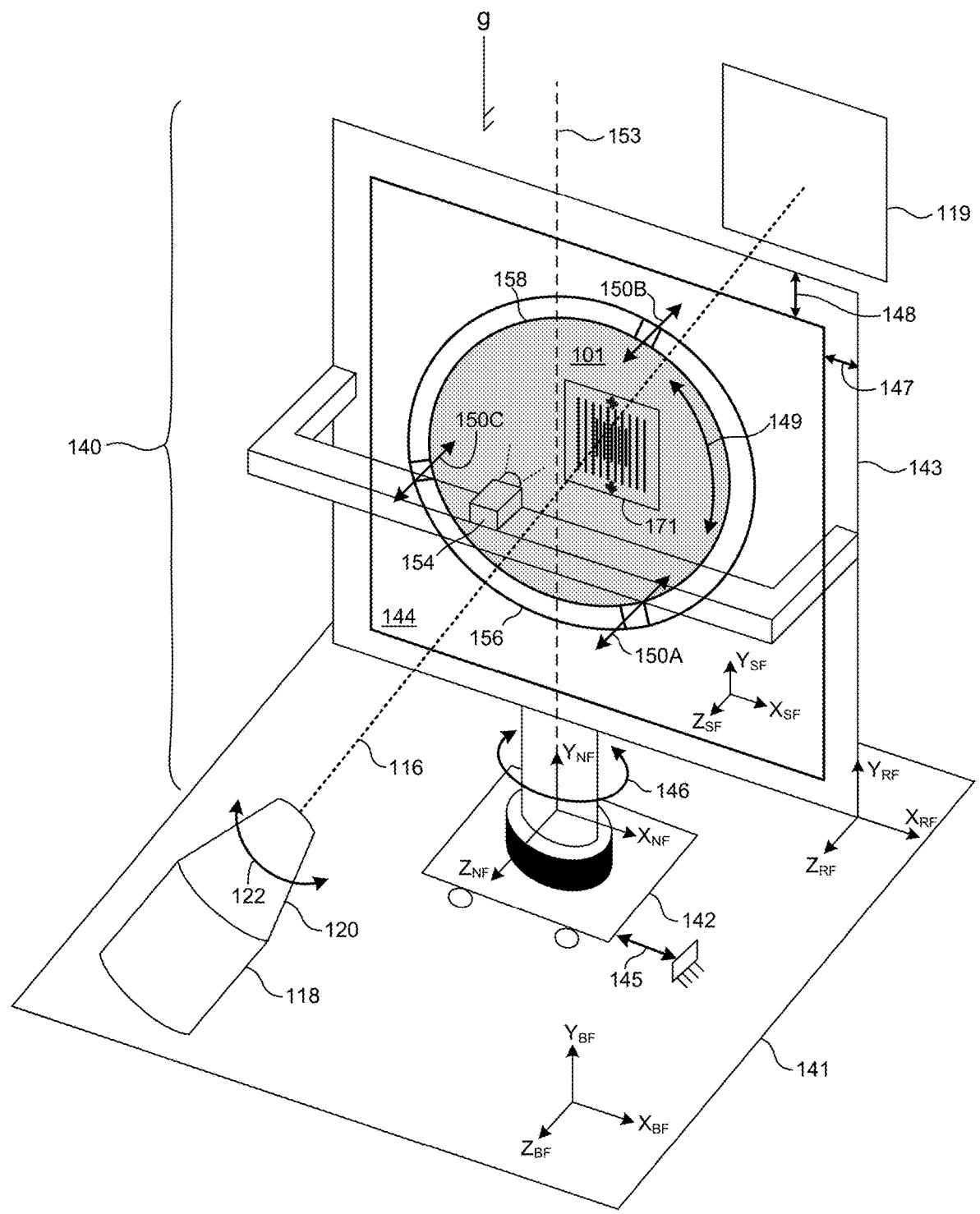
FIG. 11 depicts another illustration of specimen positioning system 140 including a periodic calibration target 171 is located on wafer 101.

FIG. 11 depicts another illustration of specimen positioning system 140 in greater detail. Like numbered elements depicted in FIG. 11 are analogous to those described with reference to FIG. 5. In the embodiment depicted in FIG. 11, a periodic calibration target 171 is located on wafer 101.

The periodic calibration target 171 includes at least one marker and multiple periodic structures (e.g., gratings). If the illumination beam 116 is incident on two or more different diffraction patterns, the ratio of measured intensities of the orders associated with the different periodic structures provides information about the location of the illumination beam with respect to the illuminated patterns. Alignment camera 154 is employed to locate the marker in coordinates of the specimen positioning system. The location of the marker with respect to the periodic structure is known apriori. Thus, the location of the periodic structure in coordinates of the specimen positioning system is easily determined by a straightforward coordinate transformation. The periodic calibration target 171 is scanned across illumination beam 116 while the detected intensities of the diffracted orders are measured by detector 119. The center of the illumination beam 116 is precisely located with respect to the periodic calibration target 171 based on the measured intensities. Since the location of the periodic calibration target 171 is known in the coordinates of the specimen positioning system, the location of center of the illumination beam in the coordinates of the specimen positioning system is precisely located by simple coordinate transformation.

In some examples, a periodic calibration target is employed to calibrate the location of incidence of the illumination beam with respect to the specimen positioning system. In some other examples, a periodic calibration target is employed to align the axis of rotation of the stage reference frame with respect to the illumination beam at the point of incidence of the illumination beam with a wafer. In some other examples, a periodic calibration target is scanned across the illumination beam at many azimuth angles. In this manner, the beam profile is characterized in addition to calibrating the position of the illumination beam with respect to the target.

In some embodiments, a periodic calibration target includes a central periodic zone and one or more periodic zones surrounding the central periodic zone. Each periodic zone includes a different pitch, a different pitch orientation, or a combination thereof.

Figure 12:
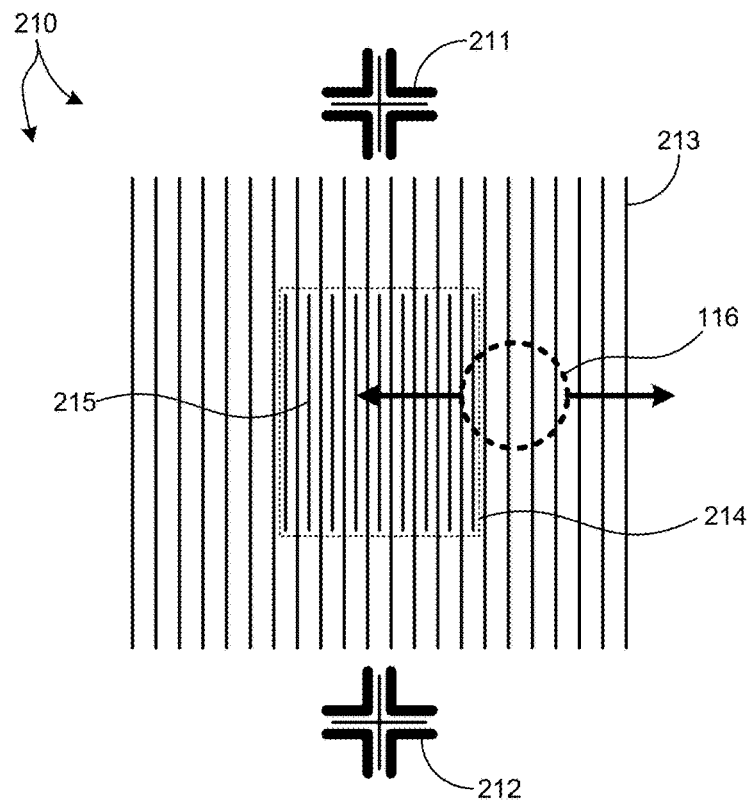
FIG. 12 depicts an embodiment of a periodic calibration target 210.

FIG. 12 depicts an embodiment of a periodic calibration target 210. As depicted in FIG. 12 periodic calibration target 210 includes markers 211 and 212 readable by an optical microscope mounted to the specimen positioning system, a small pitch periodic structure 215 located in a central zone 214 and a larger pitch periodic structure 213 in a peripheral zone around the central zone 214. Markers 211 and 212 are located in plane with the periodic structures of the periodic calibration target. In addition, the location of markers 211 and 212 with respect to the boundaries of central zone 214 are known precisely. In this manner, the location of the boundaries are determined by simple coordinate transformation from the location of either marker 211 and 212, or both.

Illumination of central zone 214 (i.e., periodic structure 215) by illumination beam 116 causes diffraction of multiple orders across detector 119 in a horizontal direction with relatively large spacing (e.g., 100 micrometers). Illumination of the peripheral zone (i.e., periodic structure 213) by illumination beam 116 causes diffraction of multiple orders across detector 119 in a horizontal direction with a smaller spacing due to the larger pitch of grating 213. The ratio of intensities between the measured orders of grating 215 and grating 213 indicates the location of illumination beam 116 relative to boundary lines between central zone 214 and the peripheral zone.

Figure 13:
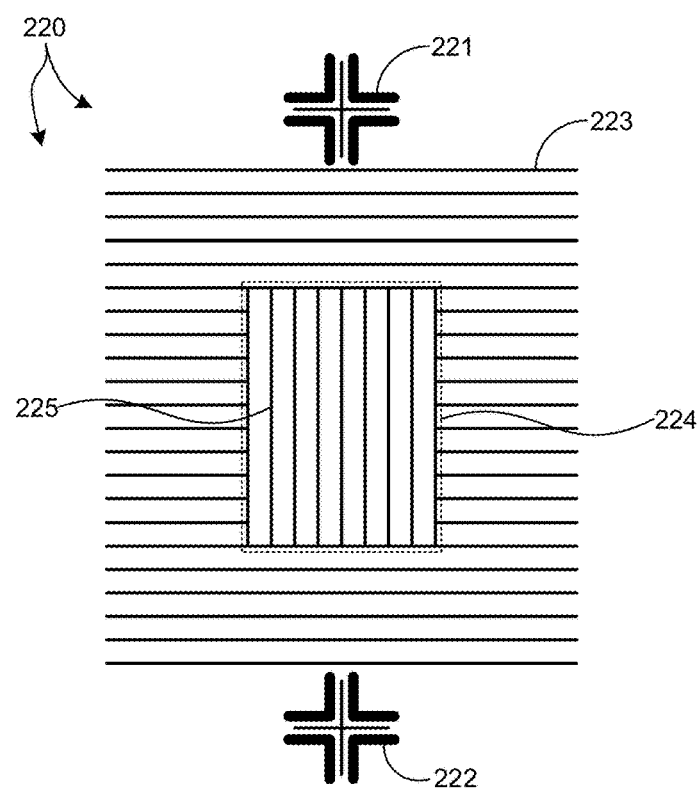
FIG. 13 depicts an embodiment of a periodic calibration target 220.

FIG. 13 depicts an embodiment of a periodic calibration target 220. As depicted in FIG. 13 periodic calibration target 220 includes markers 221 and 222 readable by an optical microscope mounted to the specimen positioning system, a vertically disposed periodic structure 225 located in a central zone 224 and a horizontally disposed periodic structure 223 in a peripheral zone around the central zone 224. Markers 221 and 222 are located in plane with the periodic structures of the periodic calibration target. In addition, the location of markers 221 and 222 with respect to the boundaries of central zone 224 are known precisely. In this manner, the location of the boundaries are determined by simple coordinate transformation from the location of either marker 221 and 222, or both.

Illumination of central zone 224 (i.e., periodic structure 225) by illumination beam 116 causes diffraction of multiple orders across detector 119 in a horizontal direction. Illumination of the peripheral zone (i.e., periodic structure 223) by illumination beam 116 causes diffraction of multiple orders across detector 119 in a vertical direction. The ratio of intensities between the measured orders of grating 225 and grating 223 indicates the location of illumination beam 116 relative to boundary lines between central zone 224 and the peripheral zone.

Figure 14:
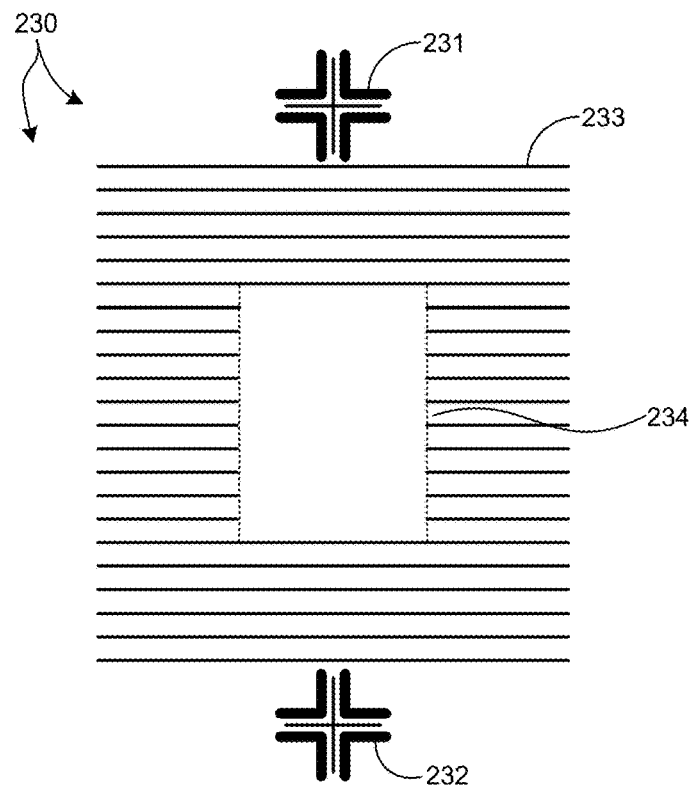
FIG. 14 depicts an embodiment of a periodic calibration target 230.

FIG. 14 depicts an embodiment of a periodic calibration target 230. As depicted in FIG. 14 periodic calibration target 230 includes markers 231 and 232 readable by an optical microscope mounted to the specimen positioning system, a horizontally disposed periodic structure 233 in a peripheral zone around a central zone 234 having no periodic structure at all. Markers 231 and 232 are located in plane with the periodic structures of the periodic calibration target. In addition, the location of markers 231 and 232 with respect to the boundaries of central zone 234 are known precisely. In this manner, the location of the boundaries are determined by simple coordinate transformation from the location of either marker 231 and 232, or both.

Illumination of central zone 234 by illumination beam 116 causes no diffraction; only the zero order is detected. Illumination of the peripheral zone (i.e., periodic structure 233) by illumination beam 116 causes diffraction of multiple orders across detector 119 in a vertical direction. The ratio of intensities between the measured orders of grating 233 and the zero order intensity indicates the location of illumination beam 116 relative to boundary lines between central zone 234 and the peripheral zone.

In some embodiments, a periodic calibration target includes any number of periodic zones that intersect at a common point. In this manner, the X-ray illumination beam is aligned with the common point shared by each of the periodic zones. Each periodic zone includes a different pitch, a different pitch orientation, or a combination thereof.

Figure 15:
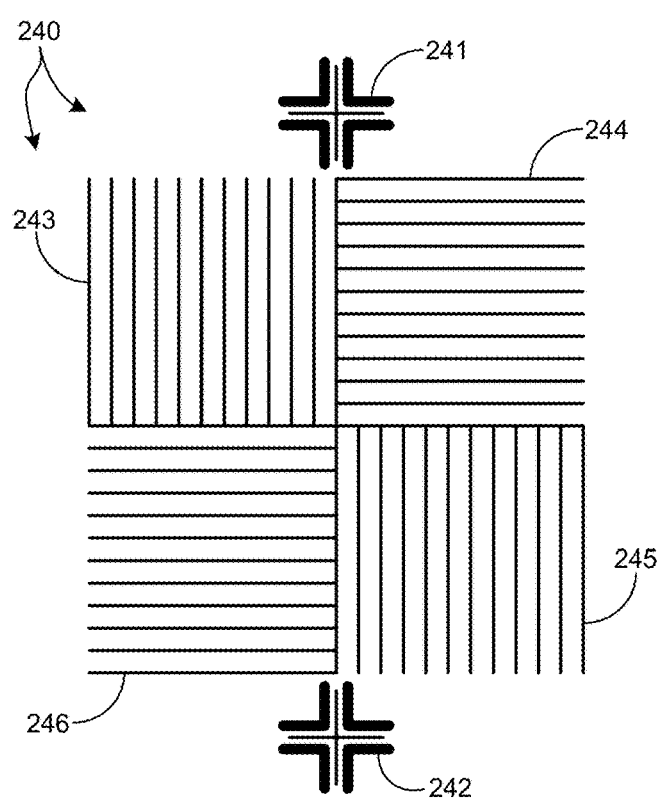
FIG. 15 depicts an embodiment of a periodic calibration target 240.

FIG. 15 depicts an embodiment of a periodic calibration target 240. As depicted in FIG. 15 periodic calibration target 240 includes markers 241 and 242 readable by an optical microscope mounted to the specimen positioning system and four periodic zones located in a quadrature arrangement. As depicted in FIG. 15, a vertically disposed periodic structure 243 is located in a first quadrant, a horizontally disposed periodic structure 244 is located in a second quadrant, a vertically disposed periodic structure 245 is located in a third quadrant, and a horizontally disposed periodic structure 246 is located in a fourth quadrant. Markers 241 and 242 are located in plane with the periodic structures of the periodic calibration target. In addition, the location of markers 241 and 242 with respect to the common point in the center of the quadrature arrangement is known precisely. In this manner, the location of the common point is determined by simple coordinate transformation from the location of either marker 241 and 242, or both.

Illumination of structures 243 and 245 by illumination beam 116 causes diffraction of multiple orders across detector 119 in a horizontal direction.

Illumination of structures 244 and 246 by illumination beam 116 causes diffraction of multiple orders across detector 119 in a vertical direction. The ratio of intensities between the measured orders indicates the location of illumination beam 116 relative to the common point shared by structures 243-246.

Figure 16:
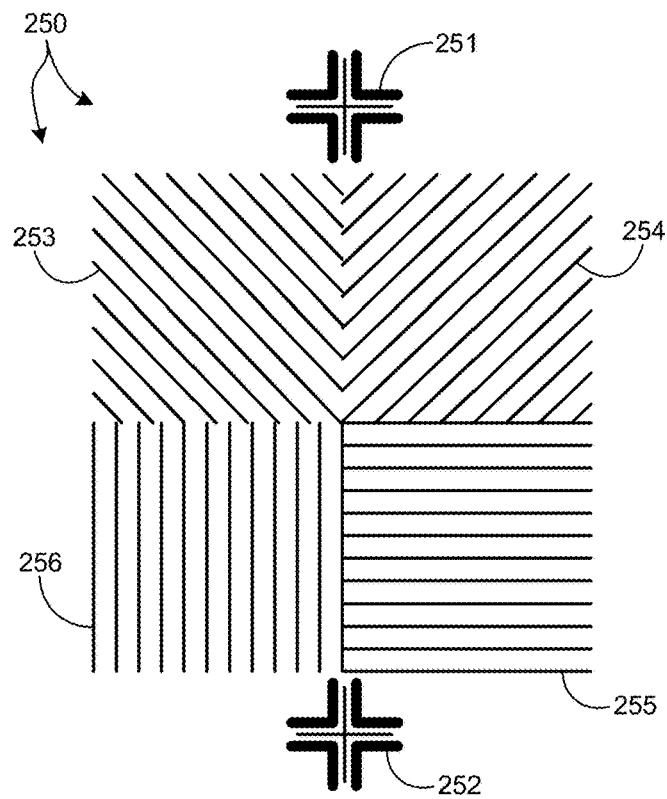
FIG. 16 depicts an embodiment of a periodic calibration target 250.

FIG. 16 depicts an embodiment of a periodic calibration target 250. As depicted in FIG. 16 periodic calibration target 250 includes markers 251 and 252 readable by an optical microscope mounted to the specimen positioning system and four periodic zones located in a quadrature arrangement. As depicted in FIG. 16, a periodic structure 253 oriented at −45 degrees with respect to vertical is located in a first quadrant, a periodic structure 254 oriented at 45 degrees with respect to vertical is located in a second quadrant, a horizontally disposed periodic structure 255 is located in a third quadrant, and a vertically disposed periodic structure 256 is located in a fourth quadrant. Markers 251 and 252 are located in plane with the periodic structures of the periodic calibration target. In addition, the location of markers 251 and 252 with respect to the common point in the center of the quadrature arrangement is known precisely. In this manner, the location of the common point is determined by simple coordinate transformation from the location of either marker 251 and 252, or both.

Illumination of structures 253 and 254 by illumination beam 116 causes diffraction of multiple orders across detector 119 at +45 and −45 degrees, respectively. Illumination of structures 255 and 256 by illumination beam 116 causes diffraction of multiple orders across detector 119 in a vertical and horizontal direction, respectively. The ratio of intensities between the measured orders indicates the location of illumination beam 116 relative to the common point shared by structures 253-256.

Figure 17:
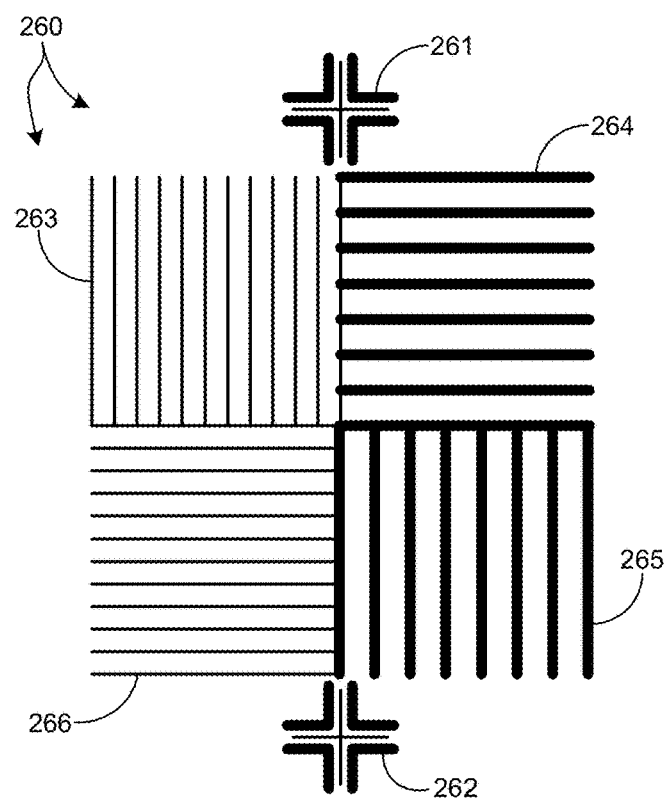
FIG. 17 depicts an embodiment of a periodic calibration target 260.

FIG. 17 depicts an embodiment of a periodic calibration target 260. As depicted in FIG. 17 periodic calibration target 260 includes markers 261 and 262 readable by an optical microscope mounted to the specimen positioning system and four periodic zones located in a quadrature arrangement. As depicted in FIG. 17, a vertically disposed periodic structure 263 having a relatively small pitch is located in a first quadrant, a horizontally disposed periodic structure 264 having a relatively large pitch is located in a second quadrant, a vertically disposed periodic structure 265 having a relatively large pitch is located in a third quadrant, and a horizontally disposed periodic structure 246 having a relatively small pitch is located in a fourth quadrant. Markers 261 and 262 are located in plane with the periodic structures of the periodic calibration target. In addition, the location of markers 261 and 262 with respect to the common point in the center of the quadrature arrangement is known precisely. In this manner, the location of the common point is determined by simple coordinate transformation from the location of either marker 261 and 262, or both.

Illumination of structures 263 and 265 by illumination beam 116 causes diffraction of multiple orders across detector 119 in a horizontal direction. Illumination of structures 264 and 266 by illumination beam 116 causes diffraction of multiple orders across detector 119 in a vertical direction. The orders associated with structures 263 and 266 are spaced differently than the orders associated with structures 264 and 265. The ratio of intensities between the measured orders indicates the location of illumination beam 116 relative to the common point shared by structures 263-266.

Figure 18:
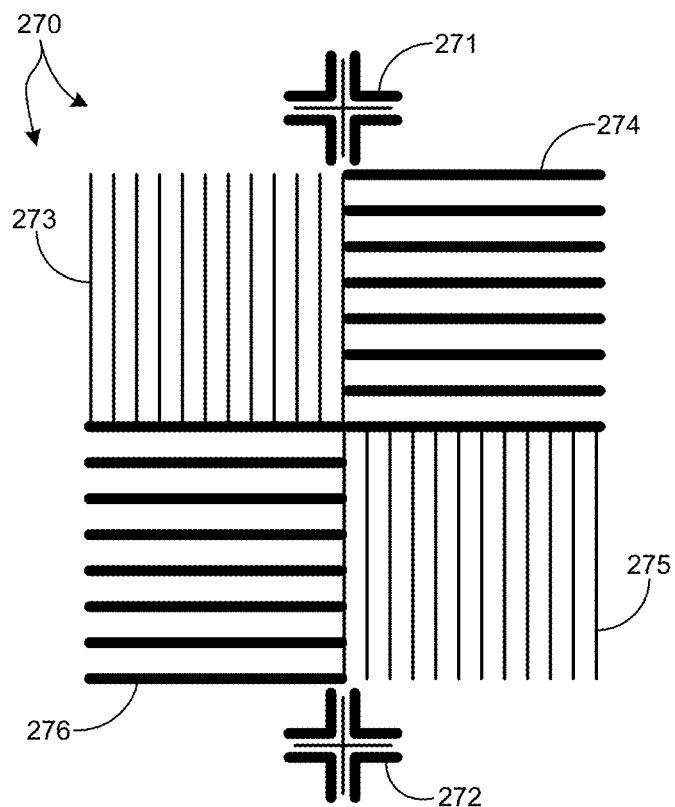
FIG. 18 depicts an embodiment of a periodic calibration target 270.

FIG. 18 depicts an embodiment of a periodic calibration target 270. As depicted in FIG. 18 periodic calibration target 270 includes markers 271 and 272 readable by an optical microscope mounted to the specimen positioning system and four periodic zones located in a quadrature arrangement. As depicted in FIG. 18, a vertically disposed periodic structure 273 having a relatively small pitch is located in a first quadrant, a horizontally disposed periodic structure 274 having a relatively large pitch is located in a second quadrant, a vertically disposed periodic structure 275 having a relatively small pitch is located in a third quadrant, and a horizontally disposed periodic structure 276 having a relatively large pitch is located in a fourth quadrant. Markers 271 and 272 are located in plane with the periodic structures of the periodic calibration target. In addition, the location of markers 271 and 272 with respect to the common point in the center of the quadrature arrangement is known precisely. In this manner, the location of the common point is determined by simple coordinate transformation from the location of either marker 271 and 272, or both.

Illumination of structures 273 and 275 by illumination beam 116 causes diffraction of multiple orders across detector 119 in a horizontal direction. Illumination of structures 274 and 276 by illumination beam 116 causes diffraction of multiple orders across detector 119 in a vertical direction. The orders associated with structures 273 and 275 are spaced differently than the orders associated with structures 274 and 276. The ratio of intensities between the measured orders indicates the location of illumination beam 116 relative to the common point shared by structures 273-276.

Figure 19A:
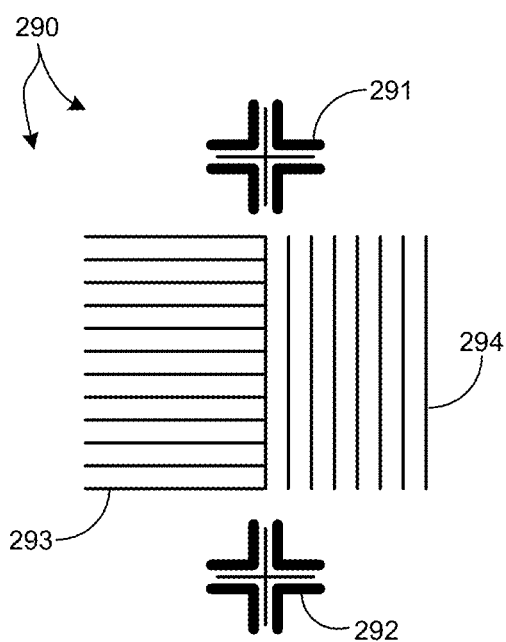
FIGS. 19A-B depict a set of periodic calibration targets 290 and 295, each suitable for locating an illumination beam with respect to the periodic calibration target in one direction.
Figure 19B:
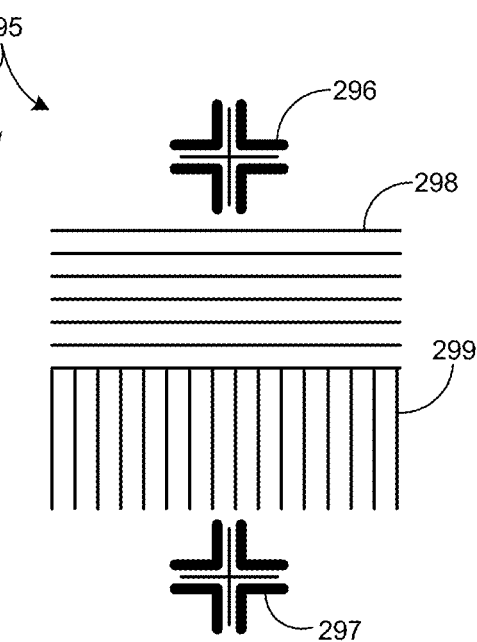

FIGS. 19A-B depict a set of periodic calibration targets 290 and 295, each suitable for locating an illumination beam with respect to the periodic calibration target in one direction. When targets 290 and 295 are both employed to calibrate a SAXS metrology system, the location of the illumination beam relative to the specimen positioning system is determined in two orthogonal dimensions. As depicted in FIG. 19A periodic calibration target 290 includes markers 291 and 292 readable by an optical microscope mounted to the specimen positioning system and two periodic zones located adjacent to one another along a boundary line. As depicted in FIG. 19A, a horizontally disposed periodic structure 293 is located alongside a vertically disposed periodic structure 294. Markers 291 and 292 are located in plane with the periodic structures of the periodic calibration target. In addition, the location of markers 291 and 292 with respect to the boundary between structures 293 and 294 is known precisely. In this manner, the location of the boundary line is determined by simple coordinate transformation from the location of either marker 291 and 292, or both.

Illumination of structures 293 and 294 by illumination beam 116 causes diffraction of multiple orders across detector 119 in a vertical and horizontal direction, respectively. The ratio of intensities between the measured orders indicates the location of illumination beam 116 relative to the boundary line shared by structures 293 and 294.

Similarly, as depicted in FIG. 19B periodic calibration target 295 includes markers 296 and 297 readable by an optical microscope mounted to the specimen positioning system and two periodic zones located adjacent to one another along a boundary line. As depicted in FIG. 19B, the boundary line of target 295 is orthogonal to the boundary line of target 290. As depicted in FIG. 19B, a horizontally disposed periodic structure 298 is located alongside a vertically disposed periodic structure 299. Markers 296 and 297 are located in plane with the periodic structures of the periodic calibration target. In addition, the location of markers 296 and 297 with respect to the boundary between structures 298 and 299 is known precisely. In this manner, the location of the boundary line is determined by simple coordinate transformation from the location of either marker 296 and 297, or both.

Illumination of structures 298 and 299 by illumination beam 116 causes diffraction of multiple orders across detector 119 in a vertical and horizontal direction, respectively. The ratio of intensities between the measured orders indicates the location of illumination beam 116 relative to the boundary line shared by structures 298 and 299.

In general, a periodic calibration target may include multiple different periodic zones in any suitable configuration. In some embodiments, the periodic zones are arranged in a Cartesian pattern. However, other patterns of periodic zones may be contemplated.

Figure 20:
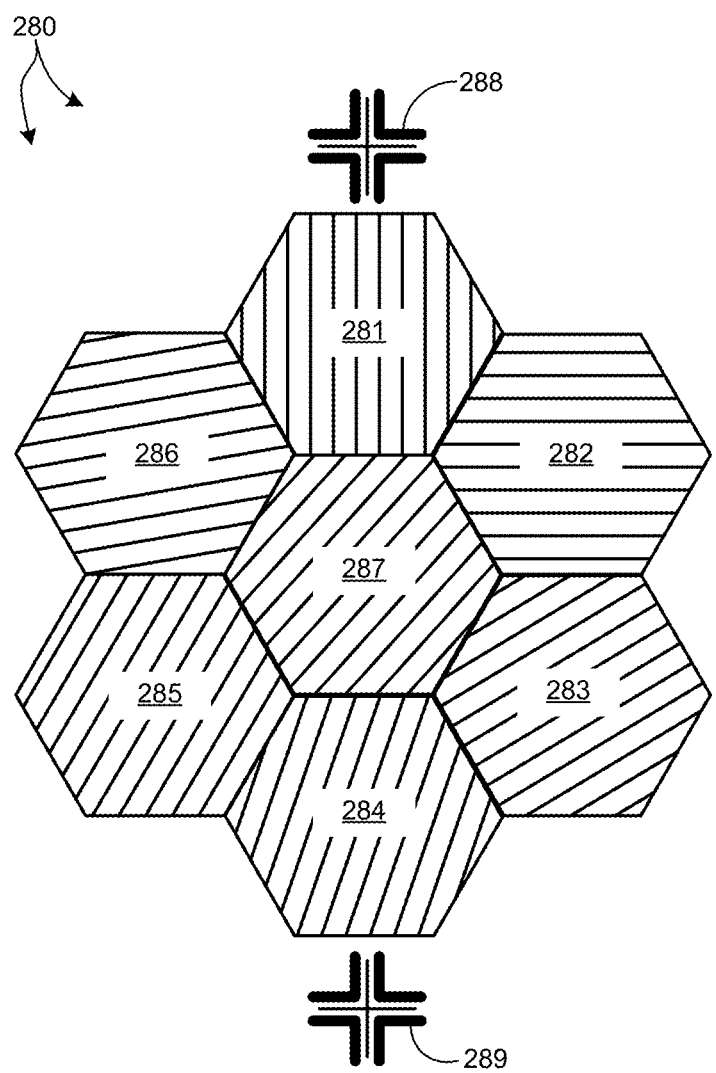
FIG. 20 depicts a periodic calibration target 280 including markers 288 and 289, and seven different periodic zones 281-287 arranged in a hexagonal pattern.

FIG. 20 depicts a periodic calibration target 280 including markers 288 and 289, and seven different periodic zones 281-287 arranged in a hexagonal pattern. Each periodic zone includes a different pitch, a different pitch orientation, or a combination thereof.

In another aspect, the shape of the surface of the wafer in the Z-direction is mapped using any of the alignment camera, an optical proximity sensor, a capacitive proximity sensor, an interferometry based sensor, or any other suitable proximity sensor. In some examples, the wafer surface is mapped on the front side (i.e., patterned side) of the wafer. In some other examples, the wafer surface is mapped on the back side (i.e., unpatterned side) of the wafer, provided the thickness of the wafer is sufficiently uniform, well modeled, or measured in-situ or apriori. In some embodiments, backside sensors are employed to measure wafer bow because many sensor technologies can be used to accurately measure the location of unpatterned surface. In some of these embodiments, backside sensors alone are employed to measure wafer bow across the backside of the wafer and the wafer bow across the front side is estimated based on a thickness model or a thickness mapping generated from thickness measurements performed apriori. In some other embodiments, backside and front side sensors are both employed to measure wafer bow. In some of these embodiments, backside sensors are employed to measure wafer bow across the backside of the wafer and the wafer bow across the front side is estimated based on a thickness model or a thickness mapping generated at least in part from estimates of wafer thickness derived from front side and backside measurements. In some examples, the wafer map is modeled using a number of standard interpolators (e.g., polynomial basis functions, rational functions, neural networks, etc.). Furthermore, it is possible to couple the lateral displacements and the height displacements using an analytical or numerical bending model of the wafer.

In a further aspect, the Z-actuators 150A-C are controlled to adjust the Z-position, Rx orientation, Ry orientation, or any combination thereof, in response to the shape of the surface of the wafer at the location of incidence of illumination beam 116. In one example, the tilt of the wafer is corrected by Z-actuators 150A-C. The tilt correction may be based on a map of wafer tilt or a value of tilt measured locally. This can also be achieved using an optical based tilt sensor that monitors the Rx orientation and Ry orientation (i.e., tip and tilt) at the back surface of the wafer.

In another further aspect, the Z-actuators 150A-C are controlled to adjust the Z-position, Rx orientation, Ry orientation, or any combination thereof, to align the axis of rotation in azimuth with the stage reference frame 143. In one example, Z-actuators 150A-C are adjusted such that a specific target remains in focus of the alignment camera 154 over a range of azimuth angles. To perform this calibration, the wafer stage translates wafer 101 in the X and Y directions to maintain the target in the field of view of the alignment camera 154 for all azimuth angles.

In general, it is not possible to calibrate for all offset effects. Calibration to remove the largest deviation is typically chosen and remaining offsets are either ignored or handled by stage maps that account for non-idealities in the wafer and stage.

In addition, changes in temperature and air pressure or any other ambient condition may have an effect on the positioning of the illumination beam. In some embodiments, beam motion is correlated to these variables and the position of the beam is adjusted based on measured temperature and pressure and the correlation model.

In general, specimen positioning system 140 may include any suitable combination of mechanical elements to achieve the desired linear and angular positioning performance, including, but not limited to goniometer stages, hexapod stages, angular stages, and linear stages.

In some embodiments, x-ray illumination source 110, focusing optics 111, slits 112 and 113, or any combination thereof, are maintained in the same atmospheric environment as specimen 101 (e.g., gas purge environment). However, in some embodiments, the optical path length between and within any of these elements is long and x-ray scattering in air contributes noise to the image on the detector. Hence in some embodiments, any of x-ray illumination source 110, focusing optics 111, and slits 112 and 113 are maintained in a localized, vacuum environment. In the embodiment depicted in FIG. 1, focusing optics 111, slits 112 and 113, and beam shaping slit mechanism 120 are maintained in a controlled environment (e.g., vacuum) within an evacuated flight tube 118. The illumination beam 116 passes through window 121 at the end of flight tube 118 before incidence with specimen 101.

Figure 21:
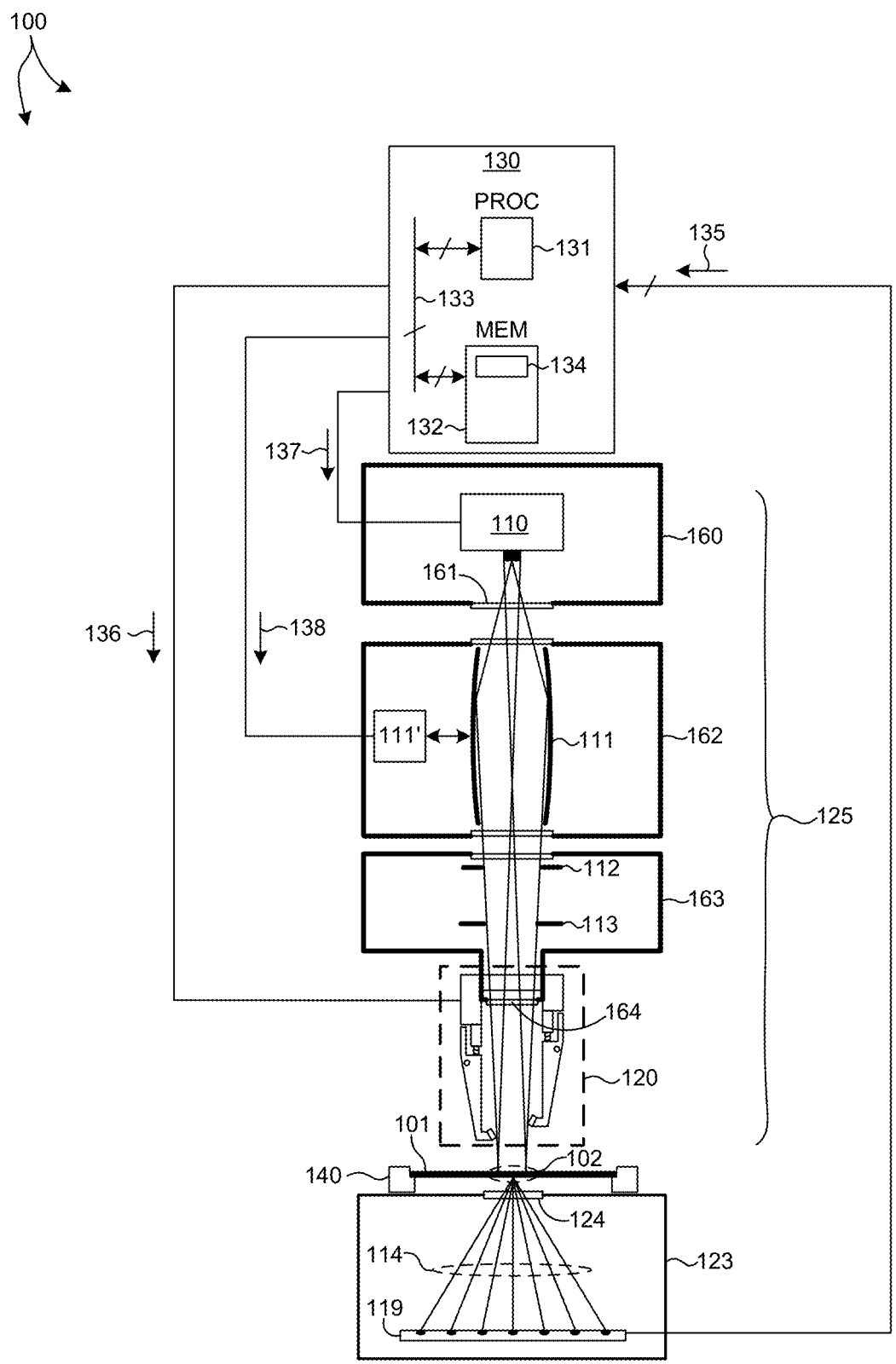
FIG. 21 is a diagram illustrative of elements of metrology system 100 contained in vacuum environments separate from specimen 101.

In some embodiments, any of x-ray illumination source 110, focusing optics 111, and slits 112 are and 113 are maintained in a localized, vacuum environment separated from one another and the specimen (e.g., specimen 101) by vacuum windows. FIG. 21 is a diagram illustrative of a vacuum chamber 160 containing x-ray illumination source 110, vacuum chamber 162 containing focusing optics 111, and vacuum chamber 163 containing slits 112 and 113. The openings of each vacuum chamber are covered by vacuum windows. For example, the opening of vacuum chamber 160 is covered by vacuum window 161. Similarly, the opening of vacuum chamber 163 is covered by vacuum window 164. The vacuum windows may be constructed of any suitable material that is substantially transparent to x-ray radiation (e.g., Kapton, Beryllium, etc.). A suitable vacuum environment is maintained within each vacuum chamber to minimize scattering of the illumination beam. A suitable vacuum environment may include any suitable level of vacuum, any suitable purged environment including a gas with a small atomic number (e.g., helium), or any combination thereof. In this manner, as much of the illumination beam path as possible is located in vacuum to maximize flux and minimize scattering.

Similarly, in some embodiments, the optical path length between specimen 101 and detector 119 (i.e., the collection beam path) is long and x-ray scattering in air contributes noise to the image on the detector. Hence, in preferred embodiments, a significant portion of the collection beam path length between specimen 101 and detector 119 is maintained in a localized vacuum environment separated from the specimen (e.g., specimen 101) by a vacuum window (e.g., vacuum window 124). In some embodiments, x-ray detector 119 is maintained in the same localized vacuum environment as the beam path length between specimen 101 and detector 119. For example, as depicted in FIGS. 1 and 21, vacuum chamber 123 maintains a localized vacuum environment surrounding detector 119 and a significant portion of the beam path length between specimen 101 and detector 119.

In some other embodiments, x-ray detector 119 is maintained in the same atmospheric environment as specimen 101 (e.g., gas purge environment). This may be advantageous to remove heat from detector 119. However, in these embodiments, it is preferable to maintain a significant portion of the beam path length between specimen 101 and detector 119 in a localized vacuum environment within a vacuum chamber.

In some embodiments, the entire optical system, including specimen 101, is maintained in vacuum. However, in general, the costs associated with maintaining specimen 101 in vacuum are high due to the complexities associated with the construction of specimen positioning system 140.

In another further aspect, beam shaping slit mechanism 120 is mechanically integrated with vacuum chamber 163 to minimize the beam path length subject to the atmospheric environment. In general, it is desirable to encapsulate as much of the beam as possible in vacuum before incidence with specimen 101. In some embodiments, the vacuum beam line extends into a hollow, cylindrically shaped cavity at the input of beam shaping slit mechanism 120. Vacuum window 164 is located at the output of vacuum chamber 163 within beam shaping slit mechanism 120 such that incoming beam 115 remains in vacuum within a portion of beam shaping slit mechanism 120, then passes through vacuum window 164 before interaction with any of slits 126-129 and specimen 101.

In another further aspect, computing system 130 is configured to generate a structural model (e.g., geometric model, material model, or combined geometric and material model) of a measured structure of a specimen, generate a T-SAXS response model that includes at least one geometric parameter from the structural model, and resolve at least one specimen parameter value by performing a fitting analysis of T-SAXS measurement data with the T-SAXS response model. The analysis engine is used to compare the simulated T-SAXS signals with measured data thereby allowing the determination of geometric as well as material properties such as electron density of the sample. In the embodiment depicted in FIG. 1, computing system 130 is configured as a model building and analysis engine configured to implement model building and analysis functionality as described herein.

Figure 22:
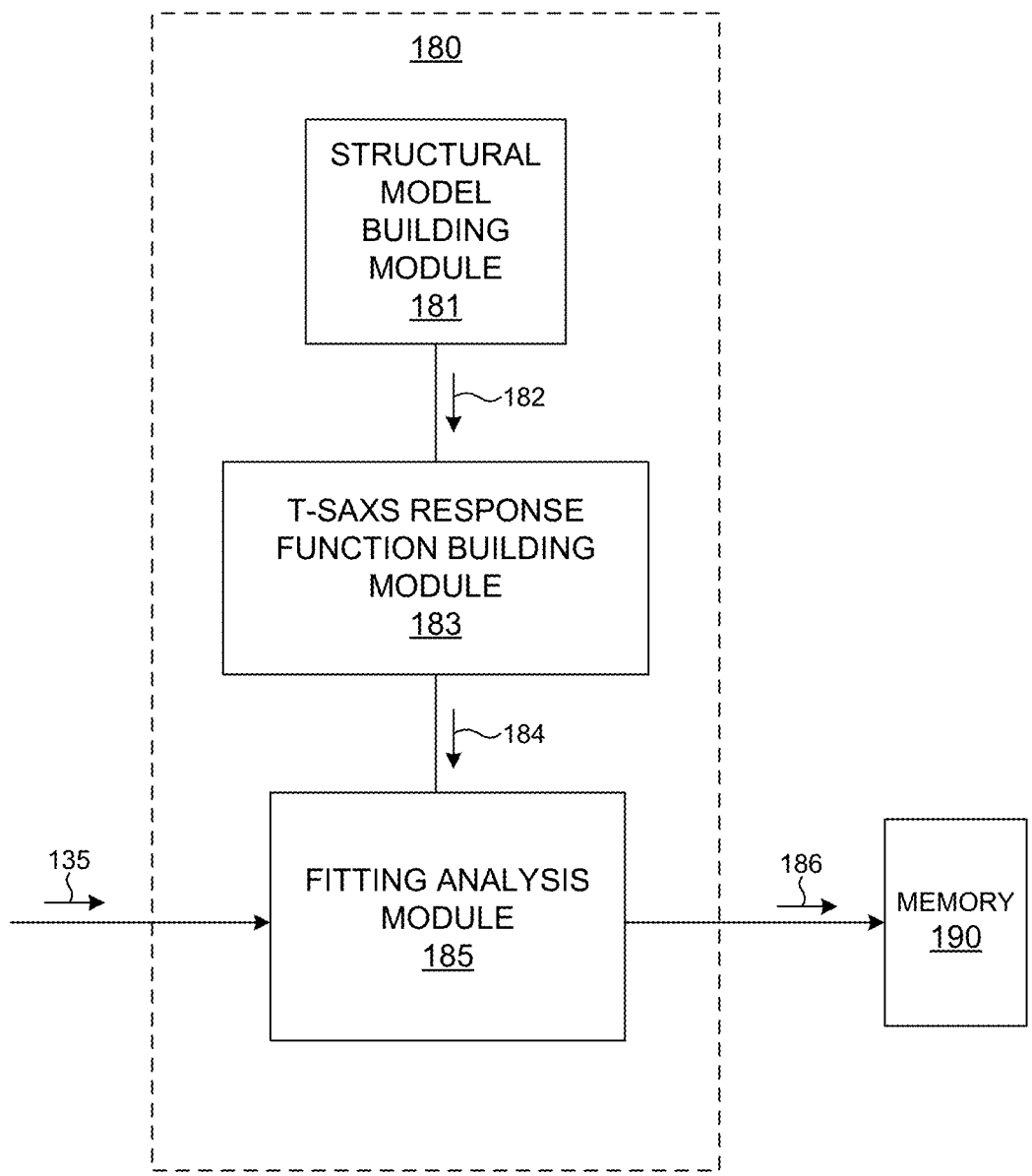
FIG. 22 is a diagram illustrative of a model building and analysis engine 180 configured to resolve specimen parameter values based on T-SAXS data in accordance with the methods described herein.

FIG. 22 is a diagram illustrative of an exemplary model building and analysis engine 180 implemented by computing system 130. As depicted in FIG. 22, model building and analysis engine 180 includes a structural model building module 181 that generates a structural model 182 of a measured structure of a specimen. In some embodiments, structural model 182 also includes material properties of the specimen. The structural model 182 is received as input to T-SAXS response function building module 183. T-SAXS response function building module 183 generates a T-SAXS response function model 184 based at least in part on the structural model 182. In some examples, the T-SAXS response function model 184 is based on x-ray form factors, $$F(\vec{q}) = \int \rho(\vec{r}) e^{-i\vec{q}\cdot\vec{r}} d\vec{r} \tag{9}$$

where F is the form factor, q is the scattering vector, and ρ(r) is the electron density of the specimen in spherical coordinates. The x-ray scattering intensity is then given by $$I(\vec{q}) = F^* F. \tag{10}$$

T-SAXS response function model 184 is received as input to fitting analysis module 185. The fitting analysis module 185 compares the modeled T-SAXS response with the corresponding measured data to determine geometric as well as material properties of the specimen.

In some examples, the fitting of modeled data to experimental data is achieved by minimizing a chi-squared value. For example, for T-SAXS measurements, a chi-squared value can be defined as $$\chi^2_{SAXS} = \frac{1}{N_{SAXS}} \sum_{j}^{N_{SAXS}} \frac{\left(s_j^{SAXS\ model}(v_1, \ldots, v_L) - s_j^{SAXS\ experiment}\right)^2}{\sigma^2_{SAXS,j}} \tag{11}$$

Where, $S_j^{SAXS\ experiment}$ is the measured T-SAXS signals 126 in the "channel" j, where the index j describes a set of system parameters such as diffraction order, energy, angular coordinate, etc. $S_j^{SAXS\ model}(v_1, \ldots, v_L)$ is the modeled T-SAXS signal $S_j$ for the "channel" j, evaluated for a set of structure (target) parameters $v_1, \ldots, v_L$, where these parameters describe geometric (CD, sidewall angle, overlay, etc.) and material (electron density, etc.). $\sigma_{SAXS,j}$ is the uncertainty associated with the jth channel. $N_{SAXS}$ is the total number of channels in the x-ray metrology. L is the number of parameters characterizing the metrology target.

Equation (11) assumes that the uncertainties associated with different channels are uncorrelated. In examples where the uncertainties associated with the different channels are correlated, a covariance between the uncertainties, can be calculated. In these examples a chi-squared value for T-SAXS measurements can be expressed as $$\chi^2_{SAXS} = \frac{1}{N_{SAXS}} \left(\vec{S}_j^{SAXS.\ model}(v_1, \ldots, v_M) - \vec{S}_j^{SAXS.\ experiment}\right)^T \tag{12}$$
$$V^{-1}_{SAXS}\left(\vec{S}_j^{SAXS.\ model}(v_1, \ldots, v_M) - \vec{S}_j^{SAXS.\ experiment}\right)$$

where, $V_{SAXS}$ is the covariance matrix of the SAXS channel uncertainties, and T denotes the transpose.

In some examples, fitting analysis module 185 resolves at least one specimen parameter value by performing a fitting analysis on T-SAXS measurement data 135 with the T-SAXS response model 184. In some examples, $\chi^2_{SAXS}$ is optimized.

As described hereinbefore, the fitting of T-SAXS data is achieved by minimization of chi-squared values. However, in general, the fitting of T-SAXS data may be achieved by other functions.

The fitting of T-SAXS metrology data is advantageous for any type of T-SAXS technology that provides sensitivity to geometric and/or material parameters of interest. Specimen parameters can be deterministic (e.g., CD, SWA, etc.) or statistical (e.g., rms height of sidewall roughness, roughness correlation length, etc.) as long as proper models describing T-SAXS beam interaction with the specimen are used.

In general, computing system 130 is configured to access model parameters in real-time, employing Real Time Critical Dimensioning (RTCD), or it may access libraries of pre-computed models for determining a value of at least one specimen parameter value associated with the specimen 101. In general, some form of CD-engine may be used to evaluate the difference between assigned CD parameters of a specimen and CD parameters associated with the measured specimen. Exemplary methods and systems for computing specimen parameter values are described in U.S. Pat. No. 7,826,071, issued on Nov. 2, 2010, to KLA-Tencor Corp., the entirety of which is incorporated herein by reference.

In some examples, model building and analysis engine 180 improves the accuracy of measured parameters by any combination of feed sideways analysis, feed forward analysis, and parallel analysis. Feed sideways analysis refers to taking multiple data sets on different areas of the same specimen and passing common parameters determined from the first dataset onto the second dataset for analysis. Feed forward analysis refers to taking data sets on different specimens and passing common parameters forward to subsequent analyses using a stepwise copy exact parameter feed forward approach. Parallel analysis refers to the parallel or concurrent application of a non-linear fitting methodology to multiple datasets where at least one common parameter is coupled during the fitting.

Multiple tool and structure analysis refers to a feed forward, feed sideways, or parallel analysis based on regression, a look-up table (i.e., "library" matching), or another fitting procedure of multiple datasets. Exemplary methods and systems for multiple tool and structure analysis is described in U.S. Pat. No. 7,478,019, issued on Jan. 13, 2009, to KLA-Tencor Corp., the entirety of which is incorporated herein by reference.

In another further aspect, an initial estimate of values of one or more parameters of interest is determined based on T-SAXS measurements performed at a single orientation of the incident x-ray beam with respect to the measurement target. The initial, estimated values are implemented as the starting values of the parameters of interest for a regression of the measurement model with measurement data collected from T-SAXS measurements at multiple orientations. In this manner, a close estimate of a parameter of interest is determined with a relatively small amount of computational effort, and by implementing this close estimate as the starting point for a regression over a much larger data set, a refined estimate of the parameter of interest is obtained with less overall computational effort.

In another aspect, metrology tool 100 includes a computing system (e.g., computing system 130) configured to implement beam control functionality as described herein. In the embodiment depicted in FIG. 1, computing system 130 is configured as a beam controller operable to control any of the illumination properties such as intensity, divergence, spot size, polarization, spectrum, and positioning of the incident illumination beam 116.

As illustrated in FIG. 1, computing system 130 is communicatively coupled to detector 119. Computing system 130 is configured to receive measurement data 135 from detector 119. In one example, measurement data 135 includes an indication of the measured response of the specimen (i.e., intensities of the diffraction orders). Based on the distribution of the measured response on the surface of detector 119, the location and area of incidence of illumination beam 116 on specimen 101 is determined by computing system 130. In one example, pattern recognition techniques are applied by computing system 130 to determine the location and area of incidence of illumination beam 116 on specimen 101 based on measurement data 135. In some examples, computing system 130 communicates command signals 137 to x-ray illumination source 110 to select the desired illumination wavelength. In some examples, computing system 130 communicates command signals 138 to actuator subsystem 111' to redirect the x-ray emission relative to base frame 141 to achieve a desired beam direction. In some examples, computing system 130 communicates command signals 136 to beam shaping slit mechanism 120 to change the beam spot size such that incident illumination beam 116 arrives at specimen 101 with the desired beam spot size and orientation. In one example, command signals 136 cause rotary actuator 122, depicted in FIG. 5, to rotate beam shaping slit mechanism 120 to a desired orientation with respect to specimen 101. In another example, command signals 136 cause actuators associated with each of slits 126-129 to change position to reshape the incident beam 116 to a desired shape and size. In some other examples, computing system 130 communicates a command signal to wafer positioning system 140 to position and orient specimen 101 such that incident illumination beam 116 arrives at the desired location and angular orientation with respect to specimen 101.

In a further aspect, T-SAXS measurement data is used to generate an image of a measured structure based on the measured intensities of the detected diffraction orders. In some embodiments, a T-SAXS response function model is generalized to describe the scattering from a generic electron density mesh. Matching this model to the measured signals, while constraining the modelled electron densities in this mesh to enforce continuity and sparse edges, provides a three dimensional image of the sample.

Although, geometric, model-based, parametric inversion is preferred for critical dimension (CD) metrology based on T-SAXS measurements, a map of the specimen generated from the same T-SAXS measurement data is useful to identify and correct model errors when the measured specimen deviates from the assumptions of the geometric model.

In some examples, the image is compared to structural characteristics estimated by a geometric, model-based parametric inversion of the same scatterometry measurement data. Discrepancies are used to update the geometric model of the measured structure and improve measurement performance. The ability to converge on an accurate parametric measurement model is particularly important when measuring integrated circuits to control, monitor, and trouble-shoot their manufacturing process.

In some examples, the image is a two dimensional (2-D) map of electron density, absorptivity, complex index of refraction, or a combination of these material characteristics. In some examples, the image is a three dimensional (3-D) map of electron density, absorptivity, complex index of refraction, or a combination of these material characteristics. The map is generated using relatively few physical constraints. In some examples, one or more parameters of interest, such as critical dimension (CD), sidewall angle (SWA), overlay, edge placement error, pitch walk, etc., are estimated directly from the resulting map. In some other examples, the map is useful for debugging the wafer process when the sample geometry or materials deviate outside the range of expected values contemplated by a parametric structural model employed for model-based CD measurement. In one example, the differences between the map and a rendering of the structure predicted by the parametric structural model according to its measured parameters are used to update the parametric structural model and improve its measurement performance. Further details are described in U.S. Patent Publication No. 2015/0300965, the content of which is incorporated herein by reference it its entirety. Additional details are described in U.S. Patent Publication No. 2015/0117610, the content of which is incorporated herein by reference it its entirety.

In a further aspect, model building and analysis engine 180 is employed to generate models for combined x-ray and optical measurement analysis. In some examples, optical simulations are based on, e.g., rigorous coupled-wave analysis (RCWA) where Maxwell's equations are solved to calculate optical signals such as reflectivities for different polarizations, ellipsometric parameters, phase change, etc.

Values of one or more parameters of interest are determined based on a combined fitting analysis of the detected intensities of the x-ray diffraction orders at the plurality of different angles of incidence and detected optical intensities with a combined, geometrically parameterized response model. The optical intensities are measured by an optical metrology tool that may or may not be mechanically integrated with an x-ray metrology system, such as systems 100 depicted in FIG. 1. Further details are described in U.S. Patent Publication No. 2014/0019097 and U.S. Patent Publication No. 2013/0304424, the contents of each are incorporated herein by reference it their entirety.

In general, a metrology target is characterized by an aspect ratio defined as a maximum height dimension (i.e., dimension normal to the wafer surface) divided by a maximum lateral extent dimension (i.e., dimension aligned with the wafer surface) of the metrology target. In some embodiments, the metrology target under measurement has an aspect ratio of at least twenty. In some embodiments, the metrology target has an aspect ratio of at least forty.

It should be recognized that the various steps described throughout the present disclosure may be carried out by a single computer system 130 or, alternatively, a multiple computer system 130. Moreover, different subsystems of the system 100, such as the specimen positioning system 140, may include a computer system suitable for carrying out at least a portion of the steps described herein. Therefore, the aforementioned description should not be interpreted as a limitation on the present invention but merely an illustration. Further, the one or more computing systems 130 may be configured to perform any other step(s) of any of the method embodiments described herein.

In addition, the computer system 130 may be communicatively coupled to the x-ray illumination source 110, beam shaping slit mechanism 120, specimen positioning system 140, and detector 119 in any manner known in the art. For example, the one or more computing systems 130 may be coupled to computing systems associated with the x-ray illumination source 110, beam shaping slit mechanism 120, specimen positioning system 140, and detector 119, respectively. In another example, any of the x-ray illumination source 110, beam shaping slit mechanism 120, specimen positioning system 140, and detector 119 may be controlled directly by a single computer system coupled to computer system 130.

The computer system 130 may be configured to receive and/or acquire data or information from the subsystems of the system (e.g., x-ray illumination source 110, beam shaping slit mechanism 120, specimen positioning system 140, detector 119, and the like) by a transmission medium that may include wireline and/or wireless portions. In this manner, the transmission medium may serve as a data link between the computer system 130 and other subsystems of the system 100.

Computer system 130 of the metrology system 100 may be configured to receive and/or acquire data or information (e.g., measurement results, modeling inputs, modeling results, etc.) from other systems by a transmission medium that may include wireline and/or wireless portions. In this manner, the transmission medium may serve as a data link between the computer system 130 and other systems (e.g., memory on-board metrology system 100, external memory, or external systems). For example, the computing system 130 may be configured to receive measurement data (e.g., signals 135) from a storage medium (i.e., memory 132 or 190) via a data link. For instance, spectral results obtained using detector 119 may be stored in a permanent or semi-permanent memory device (e.g., memory 132 or 190). In this regard, the measurement results may be imported from on-board memory or from an external memory system. Moreover, the computer system 130 may send data to other systems via a transmission medium. For instance, specimen parameter values 186 determined by computer system 130 may be stored in a permanent or semi-permanent memory device (e.g., memory 190). In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

Figure 23:
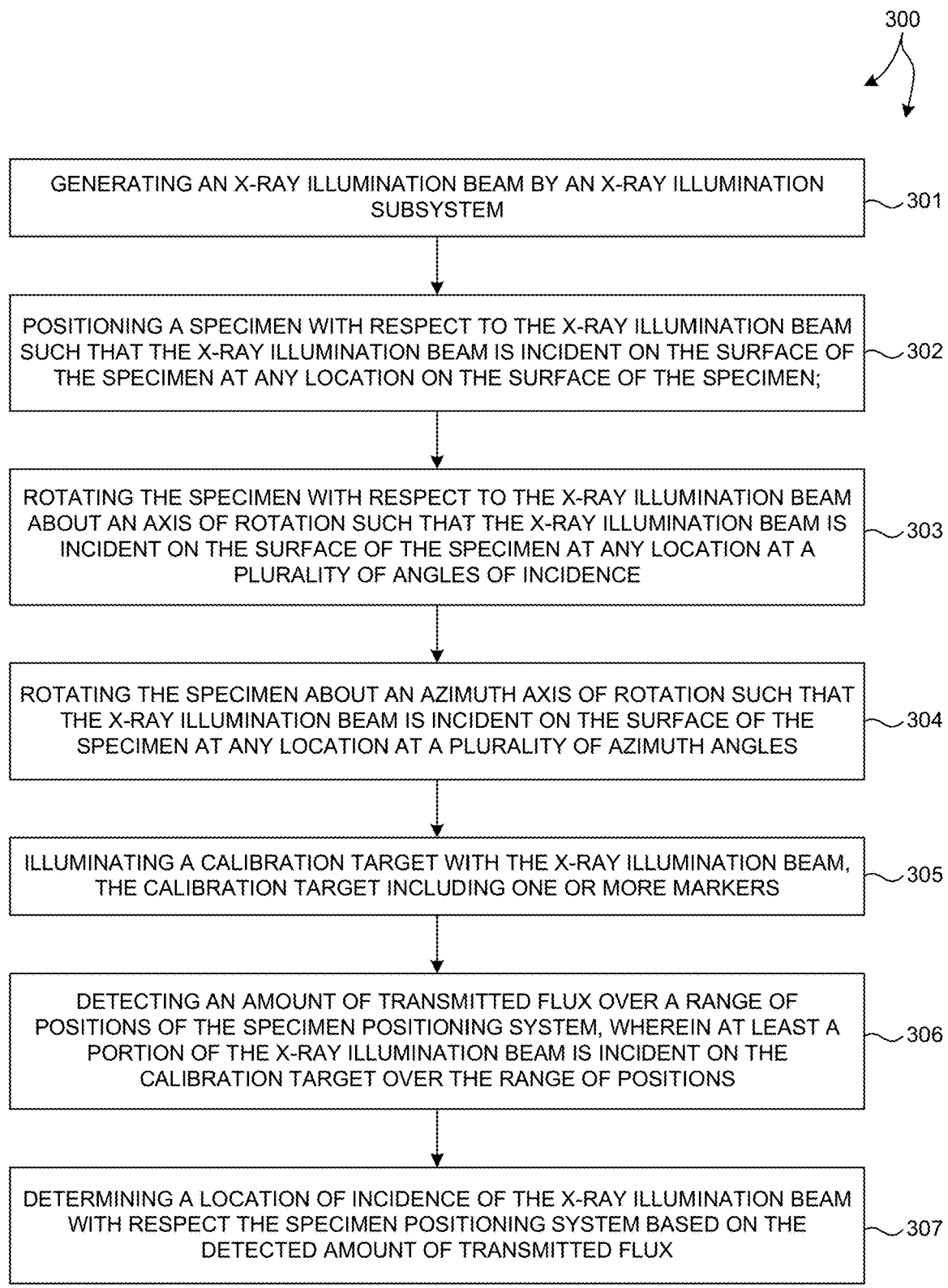
FIG. 23 depicts a flowchart illustrative of an exemplary method 300 of calibrating an angle of incidence offset value based on T-SAXS measurements at multiple angles of incidence and azimuth angles as described herein.

FIG. 23 illustrates a method 300 suitable for implementation by the metrology system 100 of the present invention. In one aspect, it is recognized that data processing blocks of method 300 may be carried out via a pre-programmed algorithm executed by one or more processors of computing system 130. While the following description is presented in the context of metrology system 100, it is recognized herein that the particular structural aspects of metrology system 100 do not represent limitations and should be interpreted as illustrative only.

In block 301, an x-ray illumination beam is generated by an x-ray illumination subsystem.

In block 302, a specimen is positioned with respect to the x-ray illumination beam such that the x-ray illumination beam is incident on the surface of the specimen at any location on the surface of the specimen.

In block 303, the specimen is rotated with respect to the x-ray illumination beam about an axis of rotation such that the x-ray illumination beam is incident on the surface of the specimen at any location at a plurality of angles of incidence.

In block 304, the specimen is rotated about an azimuth axis of rotation such that the x-ray illumination beam is incident on the surface of the specimen at any location at a plurality of azimuth angles.

In block 305, a calibration target is illuminated with the x-ray illumination beam. The calibration target includes one or more markers.

In block 306, an amount of transmitted flux is detected over a range of positions of the specimen positioning system, wherein at least a portion of the x-ray illumination beam is incident on the calibration target over the range of positions.

In block 307, a location of incidence of the x-ray illumination beam is determined with respect the specimen positioning system based on the detected amount of transmitted flux.

In some embodiments, scatterometry measurements as described herein are implemented as part of a fabrication process tool. Examples of fabrication process tools include, but are not limited to, lithographic exposure tools, film deposition tools, implant tools, and etch tools. In this manner, the results of a T-SAXS analysis are used to control a fabrication process. In one example, T-SAXS measurement data collected from one or more targets is sent to a fabrication process tool. The T-SAXS measurement data is analyzed as described herein and the results used to adjust the operation of the fabrication process tool.

Scatterometry measurements as described herein may be used to determine characteristics of a variety of semiconductor structures. Exemplary structures include, but are not limited to, FinFETs, low-dimensional structures such as nanowires or graphene, sub 10 nm structures, lithographic structures, through substrate vias (TSVs), memory structures such as DRAM, DRAM 4F2, FLASH, MRAM and high aspect ratio memory structures. Exemplary structural characteristics include, but are not limited to, geometric parameters such as line edge roughness, line width roughness, pore size, pore density, side wall angle, profile, critical dimension, pitch, thickness, overlay, and material parameters such as electron density, composition, grain structure, morphology, stress, strain, and elemental identification. In some embodiments, the metrology target is a periodic structure. In some other embodiments, the metrology target is aperiodic.

In some examples, measurements of critical dimensions, thicknesses, overlay, and material properties of high aspect ratio semiconductor structures including, but not limited to, spin transfer torque random access memory (STT-RAM), three dimensional NAND memory (3D-NAND) or vertical NAND memory (V-NAND), dynamic random access memory (DRAM), three dimensional FLASH memory (3D-FLASH), resistive random access memory (Re-RAM), and phase change random access memory (PC-RAM) are performed with T-SAXS measurement systems as described herein.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including critical dimension applications and overlay metrology applications. However, such terms of art do not limit the scope of the term "metrology system" as described herein. In addition, the metrology systems described herein may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the measurement techniques described herein.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous $SiO_2$. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, XRF disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A metrology system comprising:
   an x-ray illumination source configured to generate an x-ray illumination beam incident on a semiconductor wafer;
   a specimen positioning system configured to actively control a position of the semiconductor wafer in six degrees of freedom with respect to the x-ray illumination beam, wherein a vector normal to a surface of the wafer is approximately perpendicular to a direction of a gravitational force imposed on the semiconductor wafer by gravity during measurement of the semiconductor wafer by the metrology system;
   an x-ray detector configured to detect a first amount of x-ray radiation from the semiconductor wafer in response to the incident x-ray illumination beam; and
   a computing system configured to determine a value of a parameter of interest characterizing a structure disposed on the semiconductor wafer.

2. The metrology system of claim 1, the specimen positioning system comprising:
   a base frame;
   a stage reference frame configured to rotate with respect to the base frame about an axis of rotation that is perpendicular to the illumination beam and approximately parallel to the wafer surface;
   a wafer stage mounted to stage reference frame, the wafer stage configured to locate the wafer with respect to the incident illumination beam at any desired location over an active area of the semiconductor wafer;
   a three axis stage mounted to the wafer stage configured to move the semiconductor wafer in a direction approximately aligned with the illumination beam and to rotate the semiconductor wafer about two orthogonal axes of rotation, both approximately perpendicular to the illumination beam; and
   a rotary stage mounted to the three axis stage, the rotary stage configured to rotate the wafer about an axis approximately normal to the wafer surface.

3. The metrology system of claim 2, wherein the wafer stage and the three axis stage are mechanically coupled by six points of mechanical contact arranged in a kinematic coupling.

4. The metrology system of claim 1, the specimen positioning system comprising one or more sensors configured to measure a location of a back-side surface of the semiconductor wafer with respect to the specimen positioning system in a direction approximately normal to the wafer surface, one or more sensors configured to measure a location of a front-side surface of the semiconductor wafer with respect to the specimen positioning system in a direction approximately normal to the wafer surface, or a combination thereof.

5. The metrology system of claim 2, the specimen positioning system comprising one or more edge gripper devices configured to mechanically couple the semiconductor wafer to the rotary stage at the edges of the semiconductor wafer.

6. The metrology system of claim 1, the specimen positioning system comprising a rotary counterweight disposed on the stage reference frame, wherein a center of mass of the stage reference frame configured to rotate with respect to the base frame about the axis of rotation is approximately aligned with the axis of rotation.

7. The metrology system of claim 1, further comprising:
   a first vacuum chamber enveloping a significant portion of an illumination beam path between the x-ray illumination source and the semiconductor wafer.

8. The metrology system of claim 1, further comprising:
   a first vacuum chamber enveloping a significant portion of a collection beam path between the semiconductor wafer and the x-ray detector.

9. A metrology system comprising:
   an x-ray illumination subsystem configured to generate an x-ray illumination beam;
   a specimen positioning system configured to position a specimen with respect to the x-ray illumination beam such that the x-ray illumination beam is incident on the surface of the specimen at any location on the surface of the specimen and rotate the specimen with respect to the x-ray illumination beam about an axis of rotation such that the x-ray illumination beam is incident on the surface of the specimen at any location at a plurality of angles of incidence and rotate the specimen about an azimuth axis of rotation such that the x-ray illumination beam is incident on the surface of the specimen at any location at a plurality of azimuth angles;
   a beam occlusion calibration target including a cylindrical pin and one or more markers disposed in a plane aligned with a central axis of the cylindrical pin;
   an x-ray detector configured to detect an amount of transmitted flux over a range of positions of the specimen positioning system, wherein at least a portion of the x-ray illumination beam is incident on the cylindrical pin over the range of positions; and
   a computing system configured to determine a location of incidence of the x-ray illumination beam with respect the specimen positioning system based on the detected amount of transmitted flux.

10. The metrology system of claim 9, wherein the range of positions includes a range of angles of incidence, and wherein the computing system is further configured to determine an adjustment of a position of the axis of rotation with respect to the x-ray illumination beam to align the axis of rotation and the x-ray illumination beam.

11. The metrology system of claim 10, wherein the determining of the adjustment of the position of the axis of rotation with respect to the x-ray illumination beam is based on the detected amount of transmitted flux.

12. The metrology system of claim 10, further comprising:
an alignment camera that generates a plurality of images of at least a portion of the one or more markers or one or more markers disposed on the specimen at a plurality of different angles of incidence, and wherein a misalignment of the position of the axis of rotation with respect to the one or more markers or the one or more markers disposed on the specimen is determined based on a displacement of the one or more markers or the one or more markers disposed on the specimen measured in the plurality of images.

13. The metrology system of claim 10, further comprising:
one or more actuators configured to adjust a position of one or more elements of the x-ray illumination subsystem to adjust the position of the axis of rotation with respect to the x-ray illumination beam.

14. The metrology system of claim 10, further comprising:
one or more actuators configured to adjust the position of specimen positioning system with respect to the x-ray illumination beam to align the axis of rotation and the x-ray illumination beam.

15. The metrology system of claim 9, wherein the determining of the location of incidence of the x-ray illumination beam with respect the specimen positioning system is based on a model of transmitted flux as a function of position of the cylindrical pin with respect to the x-ray illumination beam.

16. The metrology system of claim 9, further comprising:
an alignment camera that generates an image of at least a portion of the marker, wherein the computing system is further configured to locate the marker in the coordinate system of the specimen positioning system based on the image and estimate a location of incidence of the x-ray illumination beam in the coordinate system of the specimen positioning system based on the location of the marker and a known distance between the marker and the cylindrical pin.

17. The metrology system of claim 16, wherein the alignment camera generates an image of at least one fiducial marker disposed on the specimen, and wherein the computing system is further configured to locate the fiducial marker in the coordinate system of the specimen positioning system based on the image.

18. The metrology system of claim 17, wherein the alignment camera rotates about the axis of rotation with the specimen.

19. The metrology system of claim 9, further comprising:
one or more sensors configured to measure a location of a back-side surface of the specimen with respect to the specimen positioning system in a direction approximately normal to the wafer surface, one or more sensors configured to measure a location of a front-side surface of the specimen with respect to the specimen positioning system in a direction approximately normal to the wafer surface, or a combination thereof.

20. The metrology system of claim 9, wherein the beam occlusion calibration target is disposed on the specimen positioning system or the specimen.

21. The metrology system of claim 9, further comprising:
a first vacuum chamber enveloping a significant portion of an illumination beam path between the x-ray illumination source and the specimen.

22. The metrology system of claim 9, further comprising:
a first vacuum chamber enveloping a significant portion of a collection beam path between the specimen and the x-ray detector.

23. A metrology system comprising:
an x-ray illumination source configured to generate an x-ray illumination beam;
a specimen positioning system configured to position a specimen with respect to the x-ray illumination beam such that the x-ray illumination beam is incident on the surface of the specimen at any location on the surface of the specimen and rotate the specimen with respect to the x-ray illumination beam about an axis of rotation such that the x-ray illumination beam is incident on the surface of the specimen at any location at a plurality of angles of incidence and rotate the specimen about an azimuth axis of rotation such that the x-ray illumination beam is incident on the surface of the specimen at any location at a plurality of azimuth angles, wherein each of the plurality of angles of incidence describes an angle between the x-ray illumination beam and the surface of the specimen;
a periodic calibration target including one or more periodic structures of known extent on the periodic calibration target and one or more markers disposed in a plane aligned with the one or more periodic structures;
an x-ray detector configured to detect an amount of transmitted flux over a range of positions of the specimen positioning system, wherein at least a portion of the x-ray illumination beam is incident on the one or more periodic structures over the range of positions; and
a computing system configured to determine a location of incidence of the x-ray illumination beam with respect the specimen positioning system based on the detected amount of transmitted flux.

24. The metrology system of claim 23, wherein the range of positions includes a range of angles of incidence, and wherein the computing system is further configured to determine an adjustment of a position of the axis of rotation with respect to the x-ray illumination beam based on the detected amount of transmitted flux.

25. The metrology system of claim 23, wherein the periodic calibration target includes a boundary line between two periodic structures that differ in periodicity, orientation, or both.

26. The metrology system of claim 23, wherein the periodic calibration target includes an intersection point among three of more periodic structures that differ in periodicity, orientation, or both.

27. The metrology system of claim 23, wherein the periodic calibration target is disposed on the specimen positioning system or the specimen.

28. A method comprising:
generating an x-ray illumination beam by an x-ray illumination subsystem;
positioning a specimen with respect to the x-ray illumination beam such that the x-ray illumination beam is incident on the surface of the specimen at any location on the surface of the specimen;
rotating the specimen with respect to the x-ray illumination beam about an axis of rotation such that the x-ray illumination beam is incident on the surface of the specimen at any location at a plurality of angles of incidence, wherein each of the plurality of angles of incidence describes an angle between the x-ray illumination beam and the surface of the specimen;

rotating the specimen about an azimuth axis of rotation such that the x-ray illumination beam is incident on the surface of the specimen at any location at a plurality of azimuth angles;

illuminating a calibration target with the x-ray illumination beam, the calibration target including one or more markers;

detecting an amount of transmitted flux over a range of positions of the specimen positioning system, wherein at least a portion of the x-ray illumination beam is incident on the calibration target over the range of positions; and determining a location of incidence of the x-ray illumination beam with respect the specimen positioning system based on the detected amount of transmitted flux.

29. The method of claim 28, further comprising:

determining an adjustment of a position of the axis of rotation with respect to the x-ray illumination beam to align the axis of rotation and the x-ray illumination beam, wherein the range of positions includes a range of angles of incidence.

30. The method of claim 29, wherein the determining of the adjustment of the position of the axis of rotation with respect to the x-ray illumination beam is based on the detected amount of transmitted flux.

31. The method of claim 29, further comprising:

generating a plurality of images of at least a portion of the one or more markers or one or more markers disposed on the specimen at a plurality of different angles of incidence, wherein a misalignment of the position of the axis of rotation with respect to the one or more markers or the one or more markers disposed on the specimen is determined based on a displacement of the one or more markers or the one or more markers disposed on the specimen measured in the plurality of images.

32. The method of claim 29, further comprising:

adjusting a position of one or more elements of the x-ray illumination subsystem to adjust the position of the axis of rotation with respect to the x-ray illumination beam.

33. The method of claim 29, further comprising:

adjusting the position of specimen positioning system with respect to the x-ray illumination beam to align the axis of rotation and the x-ray illumination beam.

34. The method of claim 28, wherein the calibration target includes one or more periodic structures of known extent, and wherein the one or more markers are disposed in a plane aligned with the one or more periodic structures.

35. The method of claim 28, wherein the calibration target includes a cylindrical pin, wherein the one or more markers are disposed in a plane aligned with a central axis of the cylindrical pin.

* * * * *